US009805444B2

(12) United States Patent
Lee et al.

(10) Patent No.: US 9,805,444 B2
(45) Date of Patent: Oct. 31, 2017

(54) MAGNETIC RANDOM ACCESS MEMORY (MRAM)-BASED FRAME BUFFERING APPARATUS, DISPLAY DRIVING APPARATUS AND DISPLAY APPARATUS INCLUDING THE SAME

(71) Applicant: Samsung Electronics Co., Ltd., Suwon-Si, Gyeonggi-do (KR)

(72) Inventors: Choong-jae Lee, Hwaseong-si (KR); Gwan-hyeob Koh, Seoul (KR); Dae-shik Kim, Hwaseong-si (KR); Bo-young Seo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/957,970

(22) Filed: Dec. 3, 2015

(65) Prior Publication Data
US 2016/0163254 A1 Jun. 9, 2016

(30) Foreign Application Priority Data
Dec. 8, 2014 (KR) ........................ 10-2014-0175381

(51) Int. Cl.
| | |
|---|---|
| *G09G 5/36* | (2006.01) |
| *G06T 1/60* | (2006.01) |
| *G06F 12/00* | (2006.01) |
| *G11C 5/02* | (2006.01) |
| *G11C 11/16* | (2006.01) |

(52) U.S. Cl.
CPC ................ *G06T 1/60* (2013.01); *G06F 12/00* (2013.01); *G11C 5/02* (2013.01); *G11C 11/1675* (2013.01); *G11C 11/1695* (2013.01); *G09G 2330/021* (2013.01); *G09G 2340/0435* (2013.01); *G09G 2360/12* (2013.01); *G09G 2360/18* (2013.01)

(58) Field of Classification Search
CPC .......... G09G 5/393; G09G 5/39; G09G 5/395; G09G 5/363; G06T 1/60
USPC ....................................... 345/545
See application file for complete search history.

(56) References Cited

U.S. PATENT DOCUMENTS

| | | | |
|---|---|---|---|
| 5,581,279 A | 12/1996 | Chang et al. | |
| 6,265,863 B1 | 7/2001 | Kaneko | |
| 6,958,929 B2 | 10/2005 | Abraham et al. | |
| 6,982,699 B1 | 1/2006 | Lenssen et al. | |
| 6,999,339 B2 | 2/2006 | Tuttle et al. | |
| 7,227,774 B2 | 6/2007 | Tuttle et al. | |
| 7,359,233 B2 | 4/2008 | Boeve | |
| 7,382,642 B2 | 6/2008 | Boeve | |
| 7,385,576 B2 * | 6/2008 | Moon .................. | G09G 3/3648 345/100 |

(Continued)

*Primary Examiner* — Ke Xiao
*Assistant Examiner* — Gordon Liu
(74) *Attorney, Agent, or Firm* — Ward and Smith, P.A.

(57) ABSTRACT

Magnetic random access memory (MRAM)-based frame buffering apparatus are provided that may reduce a size and power consumption thereof by using a pixel self-refresh (PSR) method. The MRAM-based frame buffering apparatus includes a frame buffer memory including magnetic random access memory (MRAM). The frame buffer memory stores at least one piece of frame data. The MRAM-based frame buffering apparatus further includes a magnetic field sensor configured to detect an external magnetic field; and a frame buffer controller configured to control the storing of the at least one piece of frame data according to the intensity of the detected external magnetic field.

17 Claims, 35 Drawing Sheets

(56) References Cited

U.S. PATENT DOCUMENTS

| | | |
|---|---|---|
| 8,395,382 B2 | 3/2013 | Phan Le et al. |
| 9,147,455 B2 * | 9/2015 | Bessho .................. G11C 11/16 |
| 2008/0080232 A1 * | 4/2008 | Sturm ..................... G11C 11/16 365/158 |
| 2010/0007344 A1 * | 1/2010 | Guo ..................... G01R 33/098 324/260 |
| 2010/0207952 A1 * | 8/2010 | Mani ........................ G09G 5/00 345/531 |
| 2014/0043892 A1 | 2/2014 | Lee et al. |
| 2014/0197505 A1 | 7/2014 | Zhou et al. |

* cited by examiner

MAGNETIC RANDOM ACCESS MEMORY (MRAM)-BASED FRAME BUFFERING APPARATUS, DISPLAY DRIVING APPARATUS AND DISPLAY APPARATUS INCLUDING THE SAME

CROSS-REFERENCE TO RELATED APPLICATION

This application claims the benefit of Korean Patent Application No. 10-2014-0175381, filed on Dec. 8, 2014, in the Korean Intellectual Property Office, the disclosure of which is incorporated herein by reference as if set forth in its entirety.

FIELD

The inventive concept relates generally to a display apparatus and, more particularly, to a display driving apparatus using a pixel self-refresh (PSR) method.

BACKGROUND

Images that are displayed by a display apparatus may be divided into still images and moving images. A display panel displays several frames per second, a still image may be displayed when the several frames have the same image data, and moving images may be displayed when the several frames have different image data. In some embodiments, if a signal controller that controls signals receives the same image data for every frame from a graphics processor when the display panel displays a still image, power consumption may increase. Accordingly, a pixel self-refresh (PSR) method may be used to decrease the power consumption of the display apparatus. The PSR method is a method in which a frame memory is added to the signal controller to store image data for a still image, and image data stored in the frame memory is provided to the display panel while displaying the still image. In the PSR method, since it is not typically required to receive image data from the graphics processor while displaying a still image, the graphics processor may be deactivated, thereby reducing power consumption.

SUMMARY

Some embodiments of the present inventive concept provide a display driving apparatus that may reduce a size and power consumption thereof by using a pixel self-refresh (PSR) method.

Further embodiments of the present inventive concept may provide a display apparatus including a display driving apparatus.

Still further embodiments of the present inventive concept provide a frame buffering apparatus including a frame buffer memory comprising magnetic random access memory (MRAM) and storing at least one piece of frame data; a magnetic field sensor configured to detect an external magnetic field; and a frame buffer controller configured to control the storing of the at least one piece of frame data according to the intensity of the detected external magnetic field.

Some embodiments of the present inventive concept provide a display driving apparatus including a frame buffer memory comprising magnetic random access memory (MRAM) and storing at least one piece of frame data; a magnetic field sensor configured to detect an external magnetic field; a signal controller configured to control signals for driving a display panel and control the storing of the at least one piece of frame data according to the intensity of the detected external magnetic field; a source driver configured to provide a data voltage to the display panel according to a data control signal and image data, received from the signal controller; and a gate driver configured to provide a gate-on voltage and a gate-off voltage to the display panel according to a gate control signal received from the signal controller.

Further embodiments of the present inventive concept provide a display apparatus including a display panel configured to display an image; a display driving apparatus configured to control signals for driving the display panel, control the storage of frame data according to the intensity of an external magnetic field, and provide a voltage corresponding to the image to the display panel; and a graphics processor configured to transmit input image data related to the image to the display driving apparatus.

Still further embodiments of the present inventive concept provide a single chip-type magnetic random access memory (MRAM) including an MRAM area formed in a magnetic tunnel junction (MTJ) structure; and a magnetic field sensor area formed in the MTJ structure and spaced apart from the MRAM area.

Some embodiments of the present inventive concept provide a frame buffering apparatus including a frame buffer memory including magnetic random access memory (MRAM); and a magnetic field sensor, coupled to the frame buffer memory, configured to sense intensity and direction of an external magnetic field applied to the frame buffer memory. The frame buffering apparatus is configured store at least one piece of frame data when the intensity of the external magnetic field is less than a threshold value. The frame buffering apparatus is configured to transmit the at least one piece of frame data to a processor if the intensity of the external magnetic field is greater than or equal to the threshold value.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
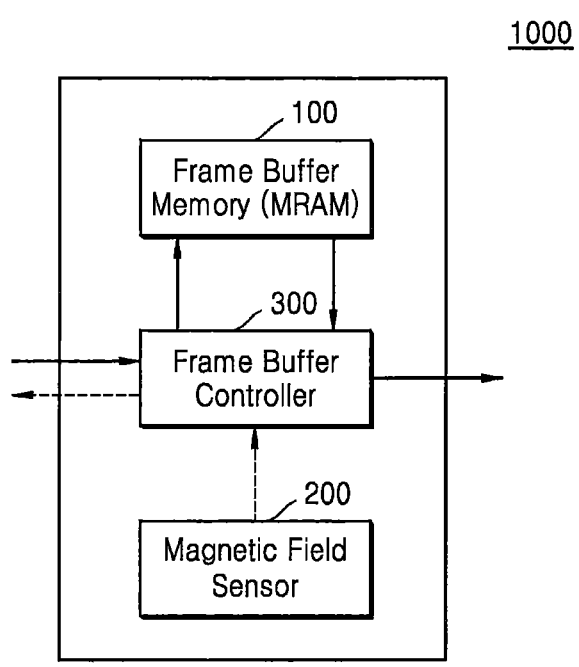
FIG. 1 is a schematic block diagram of a frame buffering apparatus according to some embodiments of the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, a schematic block diagram of a frame buffering apparatus 1000 according to some embodiments of the inventive concept will be discussed. As illustrated in FIG. 1, the frame buffering apparatus 1000 may include a frame buffer memory 100, a magnetic field sensor 200, and a frame buffer controller 300. The frame buffering apparatus 1000 is an apparatus that stores at least one piece of frame data in a memory and displays the frame data stored in the memory if, in a display apparatus, the same image, that is, a still image, has to be output for a certain time through panel self-refresh (PSR). The frame buffering apparatus 1000 may form a portion of a display driving apparatus in the display apparatus.

The frame buffer memory 100, which is a memory for storing at least one piece of frame data as described above, may be magnetic random access memory (MRAM). MRAM has been sharply reduced in cell size due to continuous scaledown. Thus, when MRAM is adopted as the frame buffer memory 100, the size of the frame buffer memory 100 and the size of the frame buffering apparatus 1000 may be reduced. Furthermore, since MRAM uses no standby power or very low standby power if any, MRAM may reduce power consumption, thereby improving the energy efficiency of the display apparatus.

In general display apparatuses, static random access memory (SRAM) is mainly used as a frame buffer memory for PSR. SRAM has a relatively large size since a cell of the SRAM generally has a 6 transistor-based structure and consumes a current in a standby mode, which is relatively small compared to that of DRAM. In this regard, SRAM is disadvantageous for energy efficiency. On the contrary, since a cell of MRAM has a 1 transistor- or 2 transistor-based structure, the size of MRAM may be sharply reduced according to the reduction of cell size. For example, MRAM may be implemented to have a cell size of 6F2 to 8F2. Here, F denotes a minimum lithographic feature size. Furthermore, the size of MRAM may be reduced to the extent of about ¼ to about ⅓ of the size of the SRAM. Furthermore, as discussed above, when MRAM is used, the MRAM is advantageous for energy efficiency since the MRAM hardly consumes standby power. Details with respect to the structure and principle of MRAMs will be discussed below with reference to FIGS. 2A through 10B.

The magnetic field sensor 200 may detect the intensity and/or direction of a magnetic field from the outside. "Outside" may refer to outside the frame buffer memory 100 formed as MRAM. In the MRAM, data writing and data reading are performed based on a magnetization direction of a free layer 43 (refer to FIG. 3) of a magnetic tunnel junction (MTJ) structure 40 (refer to FIG. 3), and an influence of an external magnetic field on data writing and data reading may increase according to a size reduction of the MRAM.

More specifically, as the MRAM is continuously scaled down to increase the integration density of the MRAM, the size of cells is reduced, and thus, the thermal stability of a free layer may be reduced, data retention may be weak, and read disturbance where cell data is changed also by a small read current may occur. In particular, when an influence of an external magnetic field exists and the direction of the external magnetic field is a direction that increases the occurrence of a read disturbance of a current flowing while performing data reading, the possibility of the occurrence of a read disturbance may increase. Furthermore, the size of a write current for changing the state of a cell changes according to the direction and the size of the external magnetic field also while performing data writing, and accordingly, the possibility of the occurrence of a write failure may also increase. For example, when the external magnetic field is about 50 Gauss (G), a read disturbance rate (RDR) may increase by about 4%, which may correspond to a 2% reduction of a margin rate of a read current. Furthermore, a write error rate (WER) may also increase by about 1%.

The frame buffering apparatus 1000 may include the magnetic field sensor 200 to detect the intensity of the external magnetic field. When the intensity of the external magnetic field detected by the magnetic field sensor 200 is equal to or greater than a threshold value, data writing to or data reading from the frame buffer memory 100, for example, the MRAM, may not be performed through the control of the frame buffer controller 300. In FIG. 1, a solid line arrow may denote a transmission path of frame data, and a dashed line arrow may denote a transmission path of external magnetic field information. The external magnetic field information may be the intensity and/or direction of the external magnetic field. A graphics processor (not shown) may be positioned on the left side of the frame buffering apparatus 1000 and a display panel (not shown) may be positioned on the right side of the frame buffering apparatus 100 (refer to FIG. 19).

The magnetic field sensor 200 may have any of various structures. For example, the magnetic field sensor 200 may have an MTJ structure. When the magnetic field sensor 200 has an MTJ structure, the magnetic field sensor 200 may be formed together with the MRAM during an MRAM manufacturing process. Accordingly, the magnetic field sensor 200 and the MRAM may be implemented together to have a one-chip structure. Although the magnetic field sensor 200 has an MTJ structure, the magnetic field sensor 200 and the MRAM may be implemented as separate chips if necessary.

The magnetic field sensor 200 may have a structure other than an MTJ structure. For example, the magnetic field sensor 200 may be formed with a magnetic sensor using a magnetic needle, a coil-type magnetic sensor, a solid-state magnetic sensor, and a resonance-type magnetic sensor. The coil-type magnetic sensor is a sensor using the principle that a voltage is generated in proportional to a time change of a magnetic flux that interlinks coils. The solid-state magnetic sensor is a sensor that applies magnetic field dependence to physical properties of a solid, and examples of the solid-state magnetic sensor include a magneto-resistor, a hall element, a flux gate magnetometer, a superconducting quantum interference device (SQUID), a fiber-optic magnetic sensor, and the like. The MTJ structure may belong to the magneto-resistor. The resonance-type magnetic sensor is a sensor that uses an atomic energy level separated according to a magnetic moment of an atomic nucleus or a magnetic field. The resonance-type magnetic sensor is used in the accurate measurement of a magnetic field, and examples of the resonance-type magnetic sensor include a proton magnetometer, an optical pumping magnetometer, and the like.

Figure 19:
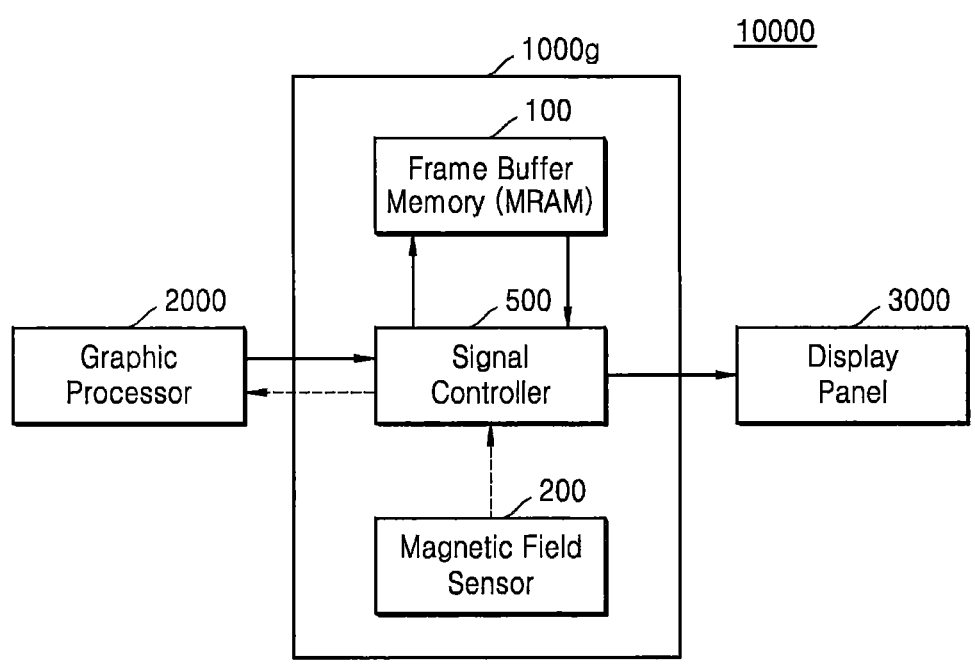
FIG. 19 is a schematic block diagram of a display apparatus according to some embodiments of the inventive concept.

The frame buffer controller 300 may receive frame data for an image from a graphics processor 2000 (refer to FIG. 19) to perform PSR, may store the received frame data in the frame buffer memory 100, and may transmit the frame data from the frame buffer memory 100 to a display panel 3000 (refer to FIG. 19). When an external magnetic field of a threshold value or more is detected by the magnetic field sensor 200, the frame buffer controller 300 may bypass the frame buffer memory 100 by not storing the frame data in the frame buffer memory 100 and directly transmit the frame data to the display panel 3000.

The frame buffer controller 300 named based on a function of controlling the storage of frame data may correspond to a signal controller 500 (refer to FIG. 19) in a display apparatus. Accordingly, the frame buffer controller 300 may control various signals for driving the display panel 3000 Furthermore to a function of controlling the storage of frame data. The signal controller 500 will be discussed further below with respect to FIG. 19.

The frame buffering apparatus 1000 may contribute to a reduction in size and power consumption of the display apparatus by adopting MRAM as the frame buffer memory 100 for performing PSR. Furthermore, as the frame buffering apparatus 1000 includes the magnetic field sensor 200 and the frame buffer controller 300 controls frame data writing to and/or frame data reading from the frame buffer memory 100 according to the intensity of an external magnetic field sensed by the magnetic field sensor 200, the display apparatus may display stable and reliable images.

Figure 2A:
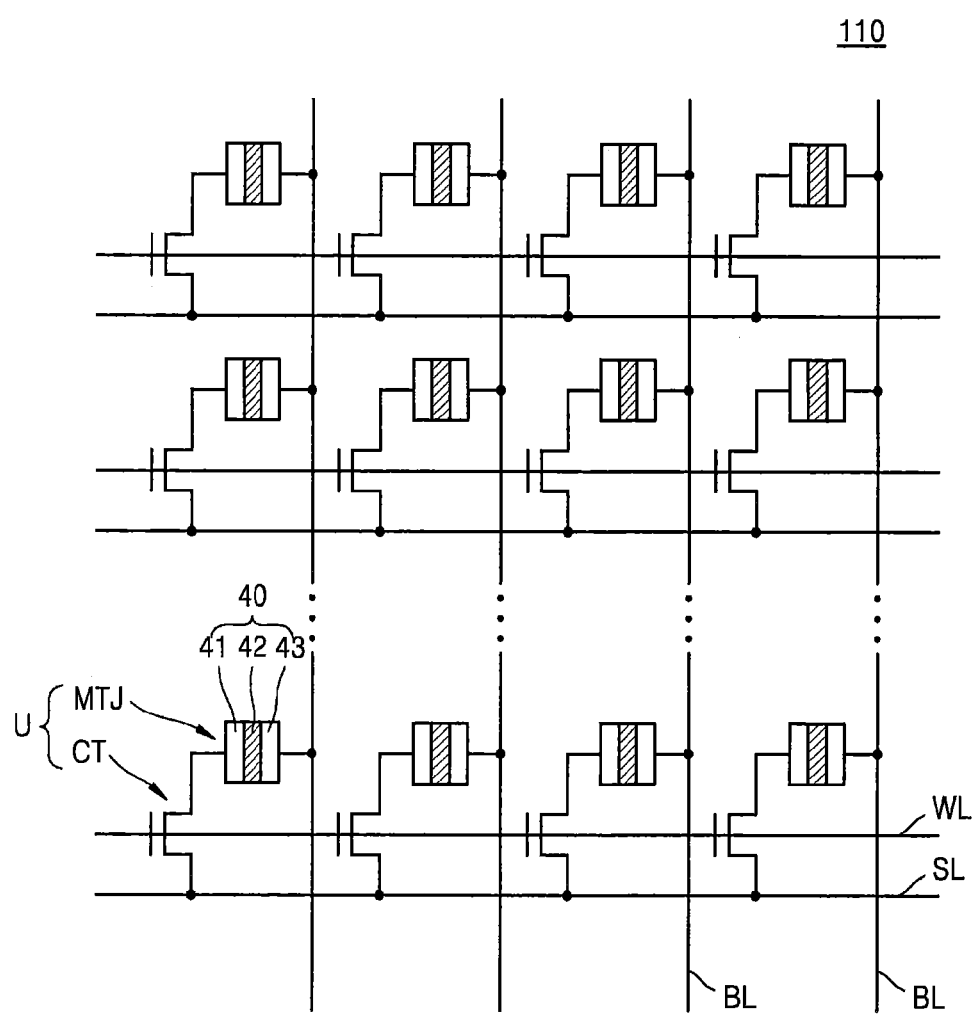
FIG. 2A is a circuit diagram of a magnetic random access memory (MRAM) cell array of MRAM adopted as a frame buffer memory of the frame buffering apparatus of FIG. 1.
Figure 2B:
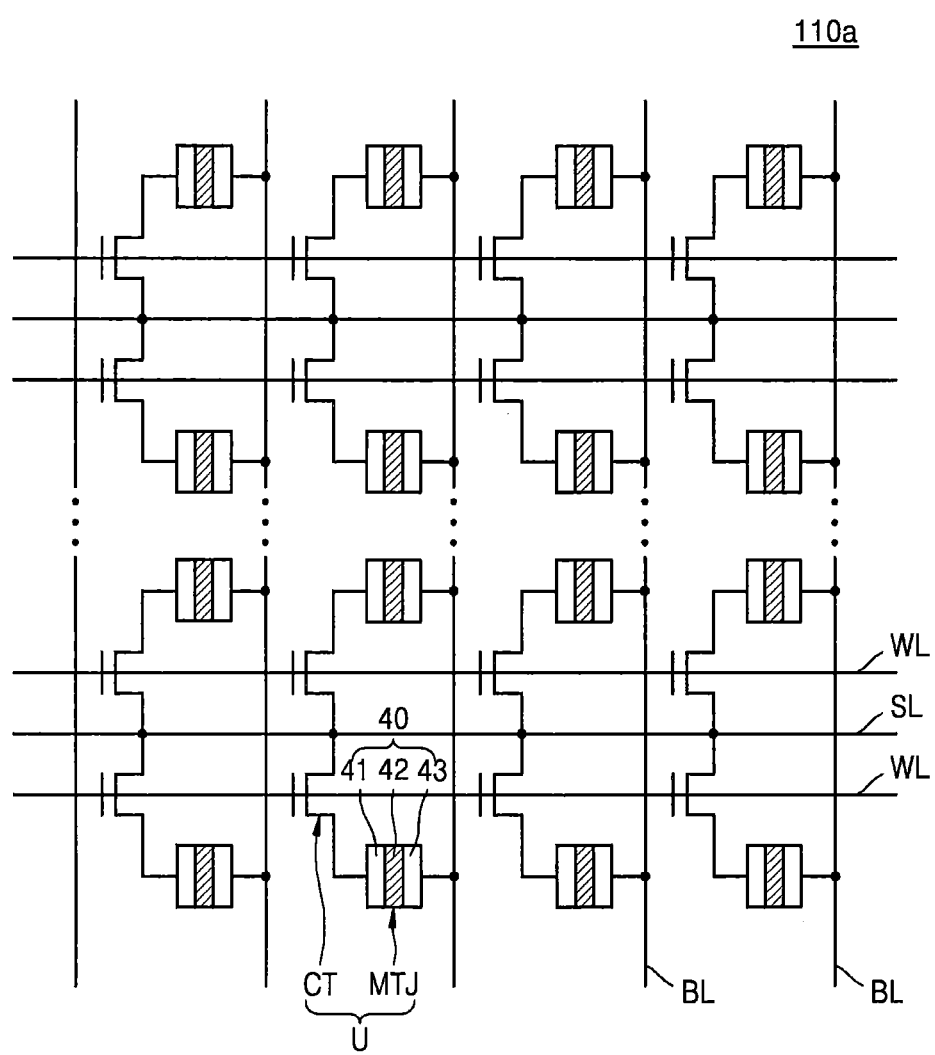
FIG. 2B is a circuit diagram of an MRAM cell array of another MRAM adopted as the frame buffer memory of the frame buffering apparatus of FIG. 1.

FIG. 2A is a circuit diagram of an MRAM cell array 110 of MRAM adopted as the frame buffer memory 100 of the frame buffering apparatus 1000 of FIG. 1, and FIG. 2B is a circuit diagram of an MRAM cell array 110a of another MRAM adopted as the frame buffer memory 100 of the frame buffering apparatus 1000 of FIG. 1.

Referring first to FIG. 2A, the MRAM cell array 110 may include a plurality of word lines WL, a plurality of bit lines BL, a plurality of source lines SL, and a plurality of memory cells U arranged on regions where the plurality of word lines WL intersect the plurality of bit lines BL. As illustrated, each of the plurality of memory cells U may include an MTJ structure 40 and a cell transistor CT, and may be selected by selecting one bit line BL and one source line SL. Accordingly, the MRAM cell array 110 may have a one MTJ-one transistor (1MTJ-1TR) structure. The MTJ structure 40 may include a pinned layer 41, a tunnel layer or barrier layer 42, and a free layer 43. Various structures of the MTJ structure 40 will be discussed below with respect to FIGS. 6A through 8B.

With respect to a connection structure of each memory cell U, the pinned layer 41 of the MTJ structure 40 may be connected to a drain of the cell transistor CT, and the free layer 43 of the MTJ structure 40 may be connected to a bit line BL. Furthermore, a source of the cell transistor CT may be connected to a source line SL, and a gate of the cell transistor CT may be connected to a word line WL.

The MTJ structure 40 may be replaced with a resistive element, such as a phase change random access memory (PRAM) using a phase change material and resistive random access memory (RRAM) using a variable resistance material, such as complex metal oxide. Furthermore, the MTJ structure 40 may be replaced with a resistive element, such as MRAM using a ferromagnetic material. Materials forming the resistive elements may have resistance values that vary according to the size and/or direction of a current or voltage and may have nonvolatile characteristics of maintaining constant resistance values although the current or voltage is blocked.

MRAM is a nonvolatile memory device based on magneto-resistance. MRAM may be different from volatile RAMs in many ways. For example, since MRAM has nonvolatile characteristics, MRAM may maintain memory contents even though a power supply of MRAM is not provided. Nonvolatile RAM is generally slower than volatile RAM, but MRAM may have a write response time and a read response time that are comparable to those of volatile RAM. For example, MRAM may be a universal memory device having low cost and high density characteristics of DRAM, high speed operation characteristics of SRAM, and nonvolatile characteristics of flash memory.

MRAM may store data by using magneto-resistance elements, unlike typical RAMs storing data as electric charges. Generally, each of the magneto-resistance elements of MRAM may be formed of two magnetic layers, and each magnetic layer may be magnetized in any one of two directions. For example, MRAM may be a nonvolatile memory device that reads data therefrom and writes data therein by using the MTJ structure including two magnetic structures and an insulating layer therebetween. A resistance value of the MTJ structure may be changed according to a magnetization direction of the magnetic structures, and data may be programmed, i.e., stored, or deleted by using a difference in a resistance value.

MRAM may change the magnetization direction of the magnetic structures by using a spin transfer torque (STT) phenomenon. The STT phenomenon is a phenomenon in which the magnetization direction of the magnetic structures is changed by spin transfer of electrons when a current having a spin polarized in one direction flows. Accordingly, MRAM using the STT phenomenon is also referred to as STT-RAM or STT-MRAM. Typical STT-MRAM may include the MTJ structure 40. The MTJ structure 40 may include the pinned layer 41, the free layer 43, and the tunnel layer 42 between the pinned layer 41 and the free layer 43 as discussed above.

In the MTJ structure 40 of the STT-MRAM, a magnetization direction of the pinned layer 41 may be fixed, and a magnetization direction of the free layer 43 may be changed by a program current applied thereto. The program current may arrange magnetization directions of two magnetic layers, i.e., the pinned layer 41 and the free layer 43, in parallel or anti-parallel to each other, by changing the magnetization direction of the free layer 43. When the magnetization directions of the two magnetic layers are parallel to each other, the resistance between the two magnetic layers may be in a low (logic "0") state. When the magnetization directions of the two magnetic layers are anti-parallel to each other, the resistance between the two magnetic layers may be in a high (logic "1") state. Write and read operations of the MRAM may be provided according to the switching of the magnetization direction of the free layer 43 and the state (the low or high state) of the resistance between the two magnetic layers.

In embodiments using a toggle-type MRAM that switches a magnetization direction of a free layer by using a magnetic field generated by a program current, scaledown is limited by write disturbance. The write disturbance is a phenomenon in which when a plurality of memory cells are arranged in a cell array of MRAM, a program current of the MRAM increases and thus a program current applied to one memory cell induces a field change of a free layer of an adjacent memory cell. The write disturbance may be resolved to some degree by using the STT phenomenon.

In particular, in the STT-MRAM, a program current typically flows through an MTJ. The pinned layer 41 polarizes an electron spin of a program current, and torque occurs when a spin-polarized electron current passes through an MTJ. The spin-polarized electron current interacts with the free layer 43 while applying the torque to the free layer 43. When the torque of the spin-polarized electron current passing through the MTJ is larger than a critical switching current density, the torque that is applied by the spin-polarized electron current may be enough to switch the magnetization direction of the free layer 43. Accordingly, the magnetization direction of the free layer 43 may be arranged parallel or anti-parallel to the pinned layer 41, and a resistance state of the MTJ structure may be changed.

Since the STT-MRAM switches the magnetization direction of the free layer 43 by using the spin-polarized electron current, it is not necessary to generate a magnetic field through the application of a large current to switch the magnetization direction of the free layer 43. Accordingly, the STT-MRAM may attribute to a reduction in the program current in addition to a reduction in the size of cells, and may also solve the write disturbance. Also, the STT-MRAM may provide a high tunnel magnetoresistance ratio, and may improve a read operation in a magnetic domain since a ratio between a high resistance state and a low resistance state is relatively high.

The word lines WL are enabled by a row decoder, and may be connected to a word line driver for generating a word line selection voltage. The word line selection voltage activates a word line WL to perform a read or write operation by using the MTJ structure.

The source lines SL are connected to a source line circuit. The source line circuit receives an address signal and a read or write signal and decodes the received signals to apply a source line selection signal to a selected source line SL. A ground reference voltage is applied to non-selected source lines SL.

The bit lines BL are connected to a column selection circuit that is driven by a column selection signal. The column selection signal is selected by a column decoder. For example, a selected column selection signal turns on a column selection transistor in the column selection circuit and selects a bit line BL. A logic state of the MTJ structure 40 is output through a sense amplifier to a bit line BL selected through a read operation. Furthermore, a write current is transferred to a bit line BL selected through a write operation and, thus, a logic state is stored in the MTJ structure 40.

Referring to FIG. 2B, a connection structure of source lines SL of the MRAM cell array 110a may be different from that of the source lines SL of the MRAM cell array 110 of FIG. 2A. For example, the MRAM cell array 110 of FIG. 2A has an 1MTJ-1TR structure in which one cell transistor CT and one MTJ structure 40 are selected by selecting one bit line BL and one source line SL, whereas the MRAM cell array 110a of FIG. 2B has a 2MTJ-2TR structure in which two cell transistors CT and two MTJ structures 40 are selected by selecting one bit line BL and one source line SL. Accordingly, in the MRAM cell array 110a, one source line SL may be connected to sources of two cell transistors CT.

In general, the structure of the MRAM cell array 110 of FIG. 2A is referred to as a separate source line structure, and the structure of the MRAM cell array 110a of FIG. 2B is referred to as a common source line structure.

In the MRAM, a current flowing through the MTJ structure 40 has to be a bi-directional current in order to store logic "0" and logic "1" in the MTJ structure 40. In other words, the direction of a current flowing through the MTJ structure 40 when writing data "0" into the MTJ structure 40 has to be opposite to that of a current flowing through the MTJ structure 40 when writing data "1" into the MTJ structure 40. Accordingly, the MRAM includes the source line SL as well as the bit line BL in order to provide a structure allowing currents of opposite directions to flow through the MTJ structure 40, and thus, the direction of a current flowing through the MTJ structure 40 may be selected by changing voltage levels of the bit line BL and the source line SL between which the MTJ structure 40 and the cell transistor CT are interposed.

According to the connection of the source line SL and an operating method, the structure of the MRAM is divided into the separate source line structure and the common source line structure. The common source line structure is advantageous in terms of size, since two adjacent cell transistors share the source line SL. However, an operating voltage may increase since a reference voltage is applied to the source line SL. On the contrary, in the separate source line structure, an operating voltage may decrease since a voltage of the bit line BL and a voltage of the source line SL are interchangeably used with each other. However, the separate source line structure may be disadvantageous in terms of size, i.e., integration density, since all source lines SL corresponding to bit lines BL have to be disposed.

Figure 3:
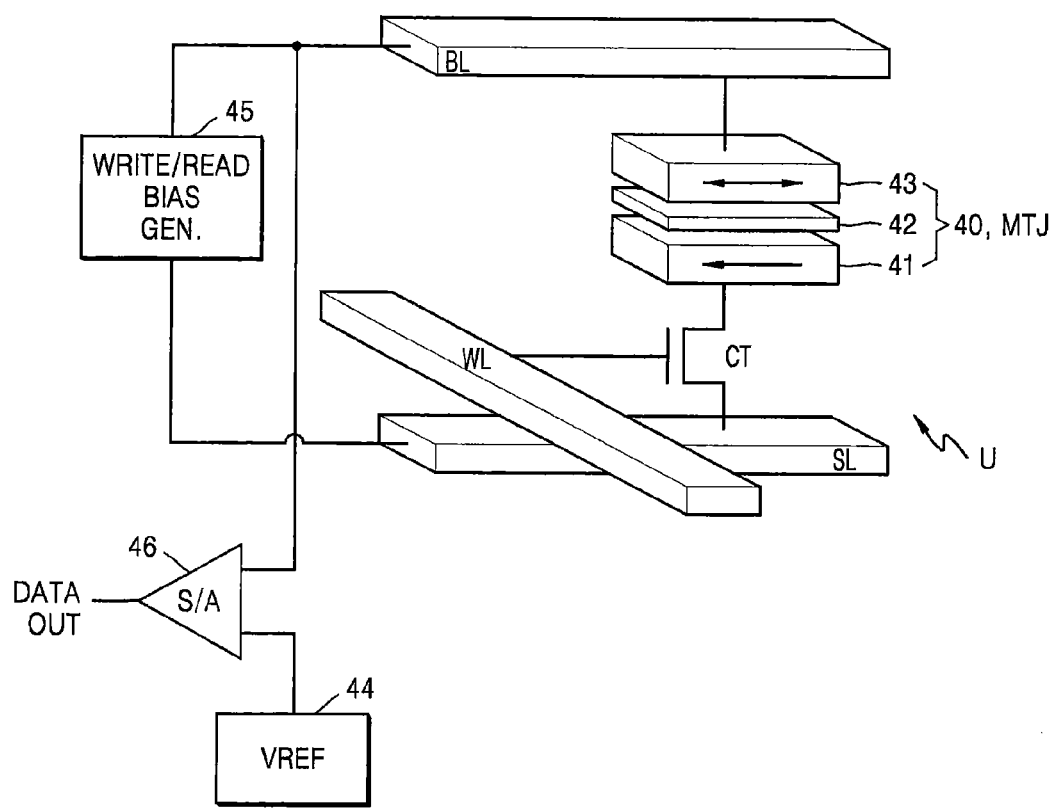
FIG. 3 is a perspective view three-dimensionally showing a unit memory cell in the MRAM cell array of FIG. 2A.

Referring now to FIG. 3, a perspective view three-dimensionally illustrating the unit memory cell U in the MRAM cell array 110 of FIG. 2A will be discussed. As illustrated in FIG. 3, the unit memory cell U may include an MTJ structure 40 and a cell transistor CT. A gate of the cell transistor CT may be connected to a word line WL, and one electrode of the cell transistor CT, for example, a drain electrode of the cell transistor CT, may be connected to a bit line BL through the MTJ structure 40. The other electrode of the cell transistor CT, for example, a source electrode of the cell transistor CT, may be connected to a source line SL.

The MTJ structure 40 may include a pinned layer 41, a free layer 43, and a barrier layer (or tunnel layer) 42 between the pinned layer 41 and the free layer 43. The magnetization direction of the pinned layer 41 may be fixed, and the magnetization direction of the free layer 43 may be parallel to or anti-parallel to that of the pinned layer 41 according to data stored by a write operation. The MTJ structure 40 may further include, for example, an anti-ferromagnetic layer to fix the magnetization direction of the pinned layer 41.

To perform a write operation of an MRAM cell, a voltage of a logic high level may be applied to a selected word line WL and thus a cell transistor CT of the MRAM cell may be turned on. A program current (i.e., a write current) provided by a read/write bias generator 45 may be applied to a selected bit line BL and a selected source line SL. The direction of the write current may be determined by a logic state to be stored in the MTJ structure 40.

To perform a read operation of an MRAM cell, a voltage of a logic high level may be applied to a selected word line WL and, thus, a cell transistor CT of the MRAM cell may be turned on, and a read current may be applied to a selected bit line BL and a selected source line SL. Accordingly, a voltage of both ends of the MTJ structure 40 may be developed, a developed voltage may be sensed by a sense amplifier 46, and a sensed voltage may be compared with a voltage of a reference voltage generator 44 to determine a logic state stored in the MTJ structure 40. Data stored in the MTJ structure 40 may be determined according to a comparison result.

Figure 4A:
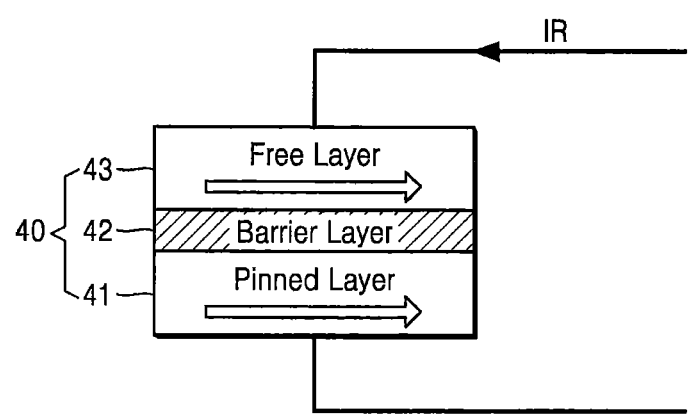
FIGS. 4A and 4B are conceptual diagrams illustrating data stored according to a magnetization direction in a magnetic tunnel junction (MTJ) structure of FIG. 3.
Figure 4B:
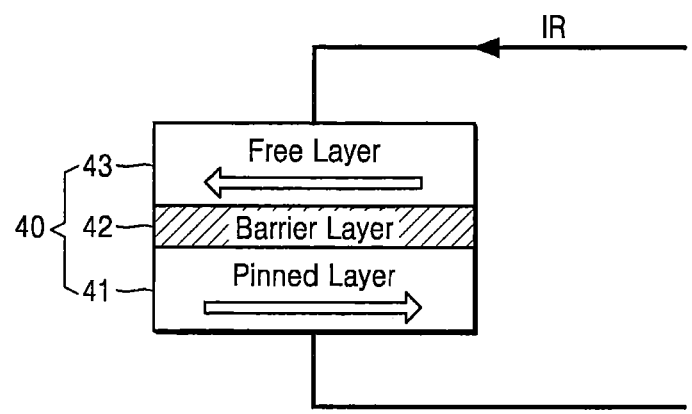

Referring now to FIGS. 4A and 4B, conceptual diagrams for explaining data stored according to a magnetization direction in the MTJ structure 40 of FIG. 3 will be discussed. As illustrated in FIGS. 4A and 4B, a resistance value of the MTJ structure 40 may vary depending on the magnetization direction of the free layer 43. When a read current IR is introduced into the MTJ structure 40, a data voltage may be output according to the resistance value of the MTJ structure 40. Since the intensity of the read current IR is much smaller than that of a write current, the magnetization direction of the free layer 43 is not changed by the read current IR.

As illustrated in FIG. 4A, the magnetization direction of the free layer 43 and the magnetization direction of the pinned layer 41 may be parallel to each other in the MTJ structure 40. In these embodiments, the MTJ structure 40 may have a low resistance value, and thus, data "0" may be output through a read operation.

As illustrated in FIG. 4B, the magnetization direction of the free layer 43 and the magnetization direction of the pinned layer 41 may be anti-parallel to each other in the MTJ structure 40. In these embodiments, the MTJ structure 40 may have a high resistance value, and thus, data "1" may be read through a read operation.

Figure 7:
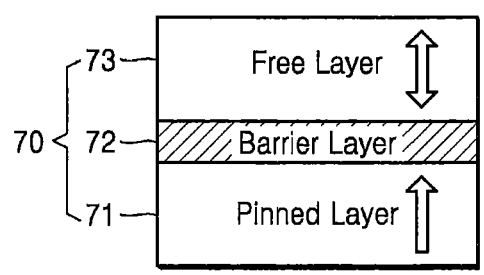
FIG. 7 is a conceptual diagram illustrating embodiments of the MTJ structure of FIG. 3.

Although the free layer 43 and the pinned layer 41 of the MTJ structure 40 are planar magnetic devices, the free layer 43 and the pinned layer 41 may have perpendicular magnetic device structures as shown in FIG. 7.

Figure 5:
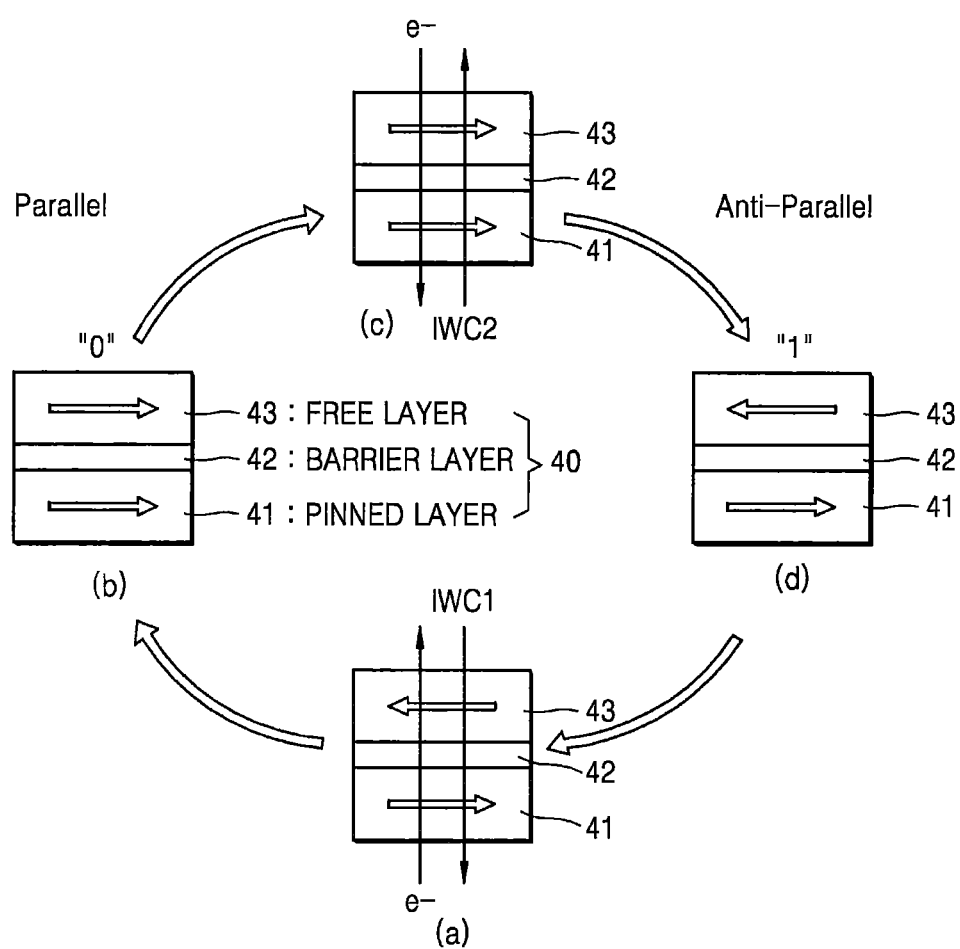
FIG. 5 is a conceptual diagram illustrating a write operation in the MTJ structure of FIG. 3.

Referring now to FIG. 5, a conceptual diagram for explaining a write operation in the MTJ structure 40 of FIG. 3 will be discussed. As illustrated in FIG. 5, the magnetization direction of the free layer 43 may be determined according to the direction of a write current IW flowing through the MTJ structure 40. For example, when a first write current IWC1 is applied from the free layer 43 to the pinned layer 41, free electrons having the same spin direction as the pinned layer 41 apply a torque to the free layer 43. Due to this, the free layer 43 may be magnetized parallel to the pinned layer 41. Accordingly, data "0" having a low resistance may be stored in the MTJ structure 40, as shown in (b).

When a second write current IWC2 is applied from the pinned layer 41 to the free layer 43 in the MTJ structure 40 in a data "0" state, as shown in (c), free electrons having an opposite spin to the pinned layer 41 may return to the free layer 43 and apply a torque to the free layer 43. Due to this, the free layer 43 may be magnetized anti-parallel to the pinned layer 41. Accordingly, data "1" having a high resistance may be stored in the MTJ structure 40, as shown in (d).

As a result, in the MTJ structure 40, the magnetization direction of the free layer 43 may be changed to be parallel to or anti-parallel to that of the pinned layer 41 by a spin transfer torque, and thus, data "0" or data "1" may be stored.

Figure 6A:
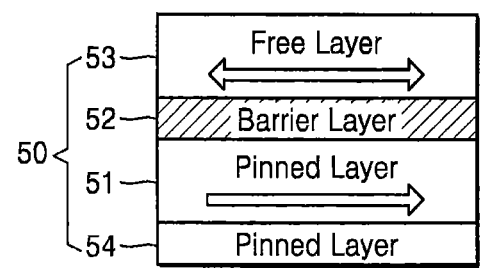
FIGS. 6A and 6B are conceptual diagrams illustrating embodiments of the MTJ structure of FIG. 3.
Figure 6B:
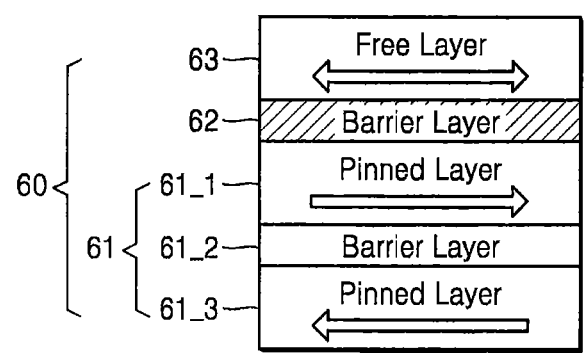

Referring now to FIGS. 6A and 6B, conceptual diagrams of MTJ structures 50 and 60 that are exemplary embodiments of the MTJ structure 40 of FIG. 3 will be discussed. As illustrated in FIG. 6A, the MTJ structure 50 may include a pinned layer 51, a tunnel layer 52 (i.e., barrier layer 52), a free layer 53, and an anti-ferromagnetic layer 54 (i.e., pinned layer 54). The free layer 53 may include a material having a variable magnetization direction. The magnetization direction of the free layer 53 may be changed according to an electrical/magnetic factor that is provided from the inside and/or outside of a memory cell. The free layer 53 may include a ferromagnetic material including at least one selected from cobalt (Co), iron (Fe), and nickel (Ni). For example, the free layer 53 may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, CuOFe2O3, $MgOFe_2O_3$, EuO, and $Y_3Fe5O_{12}$.

The tunnel layer 52 may have a thickness that is less than a spin diffusion distance. The tunnel layer 52 may include a non-magnetic material. For example, the tunnel layer 52 may include at least one selected from magnesium (Mg) oxide, titanium (Ti) oxide, aluminum (Al) oxide, magnesium-zinc (MgZn) oxide, magnesium-boron (MgB) oxide, titanium (Ti) nitride, and vanadium (V) nitride.

The pinned layer 51 may have a magnetization direction that is fixed by the anti-ferromagnetic layer 54. The pinned layer 51 may include a ferromagnetic material. For example, the pinned layer 51 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, CuOFe2O3, $MgOFe_2O_3$, EuO, and $Y_3Fe5O_{12}$.

The anti-ferromagnetic layer 54 may include an anti-ferromagnetic material. For example, the anti-ferromagnetic layer 54 may include at least one selected from PtMn, IrMn, MnO, MnS, MnTe, MnF2, FeCl2, FeO, CoCl2, CoO, NiCl2, NiO, and Cr.

Since each of the free layer 53 and the pinned layer 51 of the MTJ structure 50 is formed of a ferromagnetic body, a stray field may be generated on an edge of the ferromagnetic body. The stray field may decrease a magnetic resistance or increase a resistive magnetism of the free layer 53. Furthermore, the stray field affects switching characteristics, and thus asymmetrical switching may be formed. Accordingly, a structure, which reduces or controls the stray field that is generated in the ferromagnetic body of the MTJ structure 50, may be required.

Referring to FIG. 6B, the MTJ structure 60 may include a pinned layer 61, a tunnel layer 62 (i.e., barrier layer 62), and a free layer 63. The pinned layer 61 may have a synthetic antiferromagnetic (SAF) structure. The pinned layer 61 may include a first ferromagnetic layer 61_1 (i.e., pinned layer 61_1), a coupling layer 61_2 (i.e., barrier layer 61_2), and a second ferromagnetic layer 61_3 (i.e., pinned layer 61_3). Each of the first and second ferromagnetic layers 61_1 and 61_3 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, CuOFe2O3, $MgOFe_2O_3$, EuO, and $Y_3Fe5O_{12}$. In these embodiments, the first ferromagnetic layer 61_1 and the second ferromagnetic layers 61_3 may have different magnetization directions, and the magnetization direction of each of the first and second ferromagnetic layers 61_1 and 61_3 may be fixed. The coupling layer 61_2 may include ruthenium (Ru).

Referring now to FIG. 7, a conceptual diagram of an MTJ structure 70 that is another embodiment of the MTJ structure 40 of FIG. 3 will be discussed. As illustrated in FIG. 7, a magnetization direction of the MTJ structure 70 is perpendicular to a tunnel layer 72 (i.e., barrier layer 72), and thus, a current-moving direction and a magnetization easy axis are substantially parallel to each other. A structure of an MTJ in which a magnetization direction thereof is perpendicular to a tunnel layer is referred to as a perpendicular MTJ structure.

The MTJ structure 70 that is a perpendicular MTJ structure includes a pinned layer 71, the tunnel layer 72, and a free layer 73. When a magnetization direction of the free layer 73 and a magnetization direction of the pinned layer 71 are parallel to each other, a resistance value may decrease. When the magnetization direction of the free layer 73 and the magnetization direction of the pinned layer 71 are anti-parallel to each other, the resistance value may increase. Data may be stored in the MTJ structure 70 according to such a resistance value.

To obtain the MTJ structure 70 that is a perpendicular MTJ structure, the free layer 73 and the pinned layer 71 may be formed of a material having high magnetic anisotropy energy. Examples of the material having high magnetic anisotropy energy include an amorphous rare-earth element alloy, a multi-layered thin film, such as (Co/Pt)n or (Fe/Pt)n, and an ordered lattice material having an L10 crystal structure. For example, the free layer 73 may be an ordered alloy, and may include at least one selected from Fe, Co, Ni, palladium (Pd), and platinum (Pt). Alternatively, the free layer 73 may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_5OPt_5O$, $Fe_5OPd_5O$, $Co_5OPd_5O$, $Co_5OPt_5O$, $Fe_3ONi_2OPt_5O$, $Co_3OFe_2OPt_5O$, or $Co_3ONi_2OPt_5O$, when being chemically and quantitatively represented.

The pinned layer 71 may be an ordered alloy, and may include at least one selected from Fe, Co, Ni, Pd, and Pt. For example, the pinned layer 71 may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_5OPt_5O$, $Fe_5OPd_5O$, $Co_5OPd_5O$, $Co_5OPt_5O$, $Fe_3ONi_2OPt_5O$, $Co_3OFe_2OPt_5O$, or $Co_3ONi_2OPt_5O$, when being chemically and quantitatively represented.

Figure 8A:
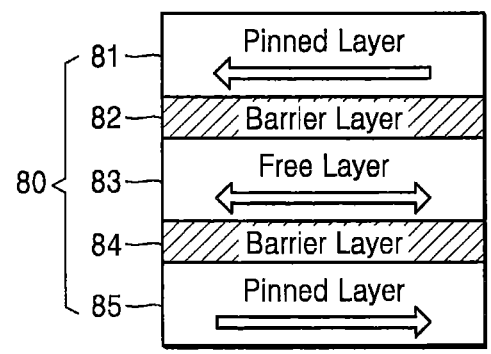
FIGS. 8A and 8B are conceptual diagrams illustrating exemplary embodiments of the MTJ structure of FIG. 3.
Figure 8B:
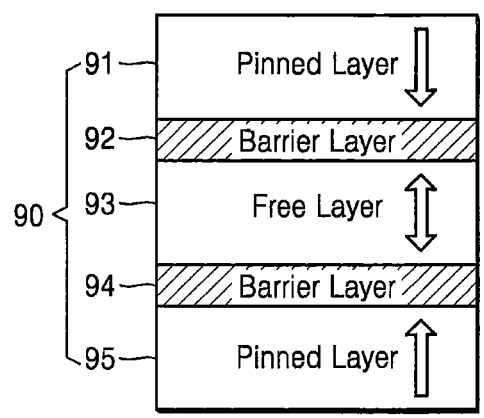

Referring now to FIGS. 8A and 8B, conceptual diagrams of dual MTJ structures 80 and 90 that are other exemplary embodiments of the MTJ structure 40 of FIG. 3 and show dual MTJ structures each having a structure in which a tunnel layer and a pinned layer are disposed at both sides of a free layer will be discussed.

As illustrated in FIG. 8A, the dual MTJ structure 80 forming horizontal magnetism may include a first pinned layer 81, a first tunnel layer 82 (i.e., barrier layer 82), a free layer 83, a second tunnel layer 84 (i.e., barrier layer 84), and a second pinned layer 85. A material used to form the first and second pinned layers 81 and 85 may be similar to a material used to form the pinned layer 51 of FIG. 6A, a material used to form the first and second tunnel layers 82 and 84 may be similar to a material used to form the tunnel layer 52 of FIG. 6A, and a material used to form the free layer 83 may be similar to a material used to form the free layer 53 of FIG. 6A.

When a magnetization direction of the first pinned layer 81 and a magnetization direction of the second pinned layer 85 are fixed to be opposite directions, a magnetic force by the first pinned layer 81 and a magnetic force by the second pinned layer 85 may be substantially offset. Accordingly, the dual MTJ structure 80 may perform a write operation by using a small amount of current, compared to a normal MTJ structure.

Since the dual MTJ structure 80 provides a relatively high resistance during a read operation due to the second tunnel layer 84, the dual MTJ structure 80 may obtain an accurate data value.

Referring to FIG. 8B, the dual MTJ structure 90 forming horizontal magnetism may include a first pinned layer 91, a first tunnel layer 92, a free layer 93, a second tunnel layer 94, and a second pinned layer 95. A material used to form the first and second pinned layers 91 and 95 may be similar to a material used to form the pinned layer 71 of FIG. 7, a material used to form the first and second tunnel layers 92 and 94 may be similar to a material used to form the tunnel layer 72 of FIG. 7, and a material used to form the free layer 93 may be similar to a material used to form the free layer 73 of FIG. 7.

In these embodiments, when a magnetization direction of the first pinned layer 91 and a magnetization direction of the second pinned layer 95 are fixed to be opposite directions, a magnetic force by the first pinned layer 91 and a magnetic force by the second pinned layer 95 may be substantially offset. Accordingly, the dual MTJ structure 90 may perform a write operation by using a small amount of current, compared to a normal MTJ structure. Furthermore, since the dual MTJ structure 90 provides a relatively high resistance, the dual MTJ structure 90 may obtain an accurate data value during a read operation.

Figure 9:
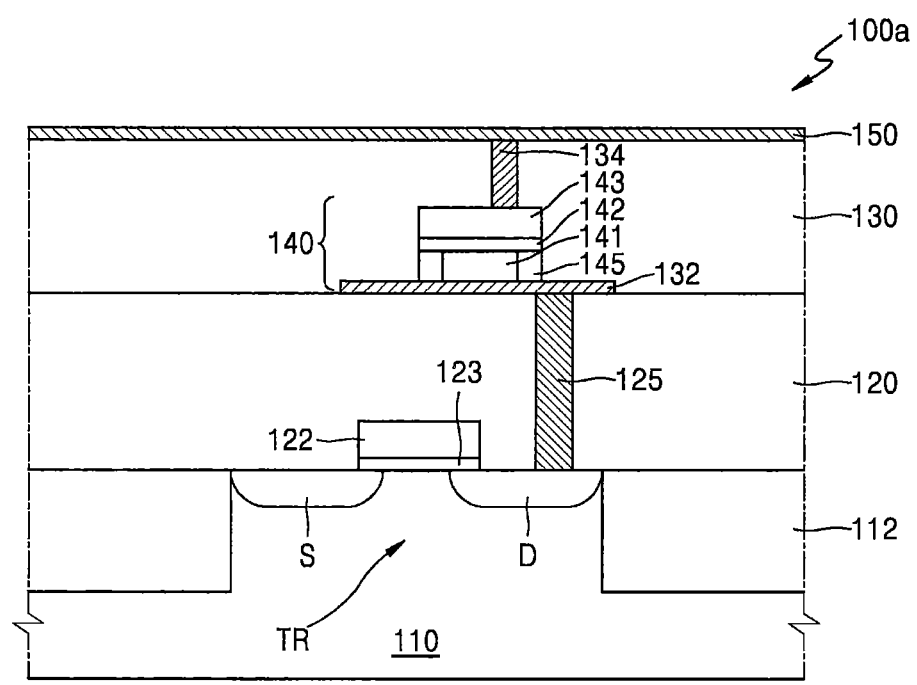
FIG. 9 is a cross-section of MRAM including the MTJ structure of FIG. 3, according to some embodiments of the inventive concept.

Referring to FIG. 9, a cross-section of MRAM 100a including an MTJ structure 140 corresponding to the MTJ structure 40 of FIG. 3, according to some embodiments of the inventive concept will be discussed. As illustrated in FIG. 9, the MRAM 100a may include a transistor TR formed as a switching device on a semiconductor substrate 110, and the MTJ structure 140 formed on the transistor TR.

The transistor TR may include a gate electrode 122 disposed on the surface of the substrate 110 and source and drain regions S and D formed in the substrate 110 at both sides of the gate electrode 122. A gate dielectric film 123 may be between the substrate 110 and the gate electrode 122. The gate electrode 122 may form a portion of a word line. A first interlayer insulating layer 120 may be formed on the substrate 110 and may cover the gate electrode 122. In FIG. 9, although the first interlayer insulating layer 120 is a single layer, the first interlayer insulating layer 120 is not limited to a single layer but may be a plurality of layers formed of a single material layer or a plurality of material layers. The transistor TR may be electrically insulated from adjacent transistors or other semiconductor devices by a device isolation layer 112.

A through-hole that exposes the drain region D of the transistor TR may be formed through the first interlayer insulating layer 120, and the inside of the through-hole may be filled with a conductive material to form a conductive plug 125. A lower electrode 132 may be formed on the first interlayer insulating layer 120 and the conductive plug 125 and thus be electrically connected to the conductive plug 125. The lower electrode 132 may include tantalum (Ta).

The MTJ structure 140 may be formed on the lower electrode 132. In some embodiments, the lower electrode 132 may be included in an MTJ structure. The MTJ structure 140 may be covered by a second interlayer insulating layer 130 formed on the first interlayer insulating layer 120. The MTJ structure 140 may include a lower magnetic layer 141 formed on the lower electrode 132, a tunnel layer 142, and an upper magnetic layer 143. The lower magnetic layer 141 may be a pinned layer, and the upper magnetic layer 143 may be a free layer. In some embodiments, the lower magnetic layer 141 may be a free layer and the upper magnetic layer 143 may be a pinned layer. Each of the lower and upper magnetic layers 141 and 143 may be a single layer or a plurality of layers. The material of the lower magnetic layer 141, the material of the tunnel layer 142, and the material of the upper magnetic layer 143 are the same as those described with reference to FIG. 6A or FIG. 7.

An insulating spacer 145 may be formed at a side of the lower magnetic layer 141, and the side of the tunnel layer 142 and the side of the upper magnetic layer 143 may form the same plane together with the side of the insulating spacer 145. Due to the insulating spacer 145, the possibility of an electrical short circuit between the lower magnetic layer 141 and the upper magnetic layer 143 may be reduced, or possibly prevented.

A via hole that passes through the second interlayer insulating layer 130 may be formed on the MTJ structure 140, and the via hole may be filled with a conductive material to form a via contact 134. A bit line 150 may be formed on the second interlayer insulating layer 130 and may be electrically connected to the MTJ structure 140 through the via contact 134. The bit line 150 may extend to cross at right angles to a word line.

Figure 10A:
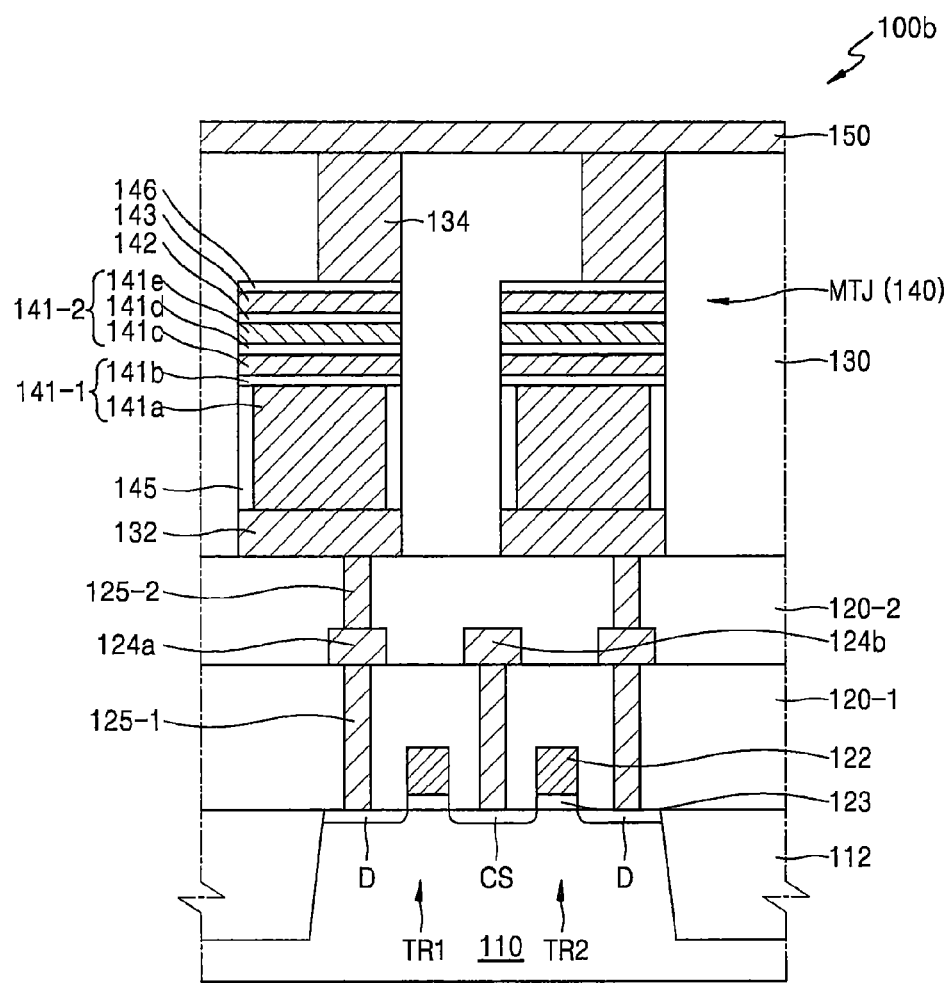
FIGS. 10A and 10B are cross-sections of MRAMs according to some embodiments of the inventive concept.
Figure 10B:
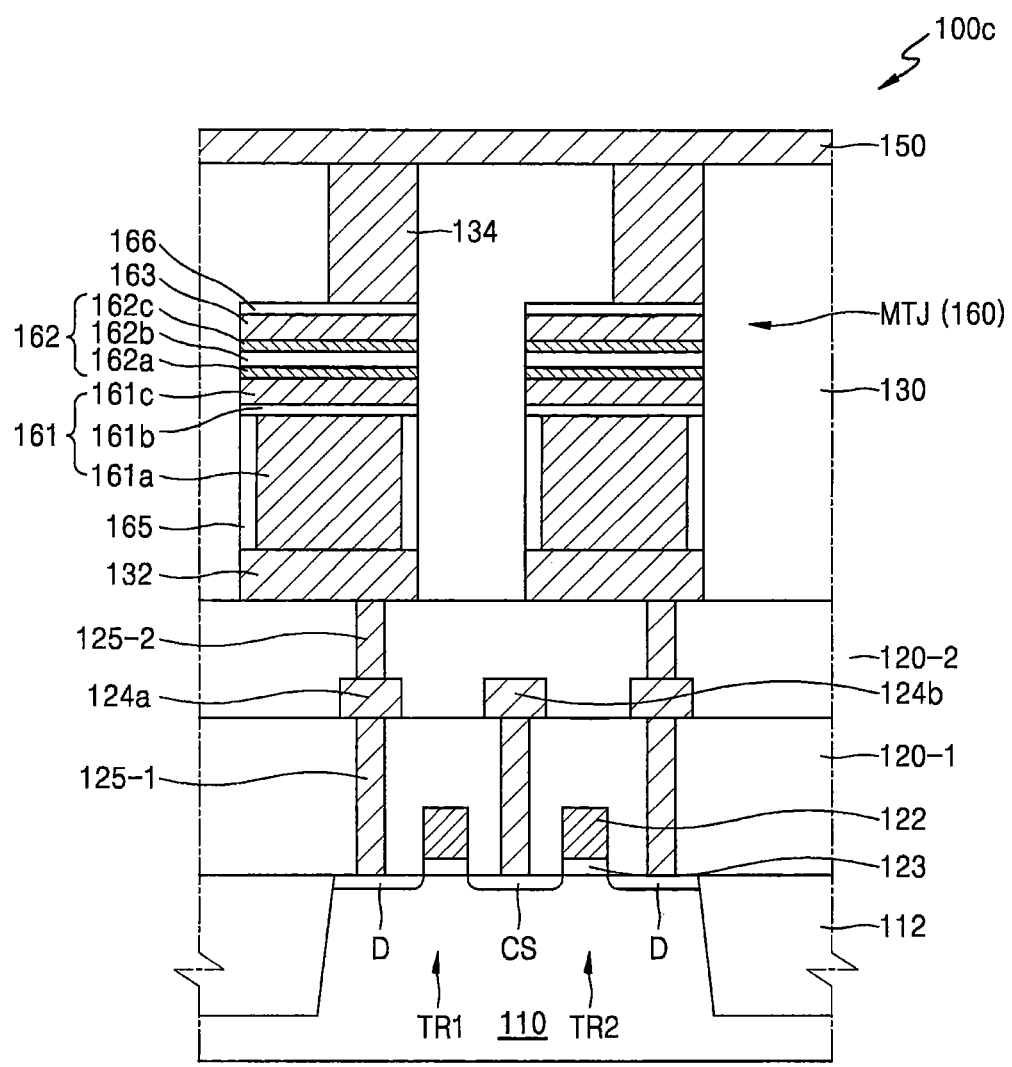

Referring now to FIGS. 10A and 10B, cross-sections of MRAMs 100b and 100c according to some embodiments of the inventive concept will be discussed. As illustrated in FIG. 10A, the MRAM 100b may include two transistors TR1 and TR2 formed on a semiconductor substrate 110 and two MTJ structures 140 corresponding to the two transistors TR1 and TR2. The two transistors TR1 and TR2 may be formed to be adjacent to each other on an active region defined by a device isolation layer 112. The MTJ structures 140 may have a planar structure having a magnetization direction in a horizontal direction with respect to a tunnel layer.

More specifically, a gate electrode 122 may be formed on the semiconductor substrate 110 of an active region, with a gate dielectric film 123 therebetween, and a source region CS and a drain region D may be formed by implanting the semiconductor substrate 110 at both sides of the gate electrode 122 with impurities. The source region CS may be a common source region that is shared by the two transistors TR1 and TR2.

The gate electrode 122 may form a word line and may have a shape extending in one direction. Although not illustrated in FIG. 10A, a gate spacer may be formed at both sides of the gate electrode 122. A first interlayer insulating layer 120-1 may be formed on the semiconductor substrate 110, thus covering the transistors TR1 and TR2, and a first contact plug 125-1 may be formed through the first interlayer insulating layer 120-1 to contact the drain region D. First and second pad electrodes 124a and 124b may be formed on the first interlayer insulating layer 120-1 and the first contact plug 125-1 and be electrically connected to the first contact plug 125-1, and a second interlayer insulating layer 120-2 may be formed on the first and second pad electrodes 124a and 124b, thus covering the first and second pad electrodes 124a and 124b. A second contact plug 125-2 may be formed through the second interlayer insulating layer 120-2 to contact the first pad electrode 124a. Although not illustrated in FIG. 10A, the second pad electrode 124b may be connected to a common source line.

A lower electrode 132 and the MTJ structure 140 may be formed on the second interlayer insulating layer 120-2 and the second contact plug 125-2. In some embodiments, the lower electrode 132 may be included in the MTJ structure 140. The MTJ structure 140 may include a first lower pinned layer 141-1, a second lower pinned layer 141-2, a tunnel layer 142, a free layer 143, and a capping layer 146. The MTJ structure 140 may be covered by a third interlayer insulating layer 130 formed on the second interlayer insulating layer 120-2.

The first lower pinned layer 141-1 may include a first pinned layer 141a and an additional pinned layer 141b. The first pinned layer 141a may contact the lower electrode 132, and may include a material having a magnetization direction in a horizontal direction with respect to the tunnel layer 142. The first pinned layer 141a may have magnetization directions that are different alternately at internal positions thereof, and thus, as a whole, there may be no magnetization direction in the first pinned layer 141a. The first pinned layer 141a may include at least one selected from Co, Fe, Tb, Ru, Pd, Pt, Mn, Ir, and an alloy of at least two of them. For example, the first pinned layer 141a may be formed of PtMn, IrMn, or the like. The height of the first pinned layer 141a may be 50% or more of the total height of the MTJ structure 140.

The additional pinned layer 141b may be formed of the same material as the first pinned layer 141a. The additional pinned layer 141b may have a width that is greater than that of the first pinned layer 141a. Accordingly, the additional pinned layer 141b may protrude at the side of the first pinned layer 141a while covering the entire upper surface of the first pinned layer 141a. The additional pinned layer 141b may have a very small thickness, for example, a thickness of about 1 Å through about 10 Å.

An insulating spacer 145 is formed at a side of the first pinned layer 141a, and the side of the insulating spacer 145 and the side of the additional pinned layer 141b may form the same plane.

The second lower pinned layer 141-2 may be formed to have a width, which is similar to that of the additional pinned layer 141b, on the additional pinned layer 141b. Accordingly, the second lower pinned layer 141-2 may have a thickness that is less than that of the first pinned layer 141a and a width that is greater than that of the first pinned layer 141a. The second lower pinned layer 141-2 may have an SAF structure. For example, the second lower pinned layer 141-2 may have a structure in which a first ferromagnetic layer 141c, a coupling layer 141d, and a second ferromagnetic layer 141e are stacked. The first and second ferromagnetic layers 141c and 141e may be formed of, for example, CoFeB, CoFe, NiFe, FePt, or CoPt. In the second lower pinned layer 141-2, the first ferromagnetic layer 141c may have a magnetization direction that is the same as that of the uppermost layer of the first pinned layer 141a, and the magnetization direction of the first ferromagnetic layer 141c may be fixed. The second ferromagnetic layer 141e may have a magnetization direction that is different from that of the first pinned layer 141a, and the magnetization direction of the second ferromagnetic layer 141e may be fixed. The coupling layer 141d may include Ru. That is, the first and second ferromagnetic layers 141c and 141e with the coupling layer 141d therebetween may have a loop-shaped magnetic field.

The tunnel layer 142 may include a metal oxide having insulation properties. For example, the tunnel layer 142 may include MgO or $AlO_x$.

The free layer 143 may have a magnetization direction that is changeable in a horizontal direction. The free layer 143 may be formed of a ferromagnetic material, and may be formed by using a material having high spin polarization intensity. For example, the free layer 143 may be formed of CoFeB, CoFe, NiFe, FePt, or CoPt.

The capping layer 146 may include tantalum. In some embodiments, the capping layer 146 may not be formed.

An upper electrode 134 may be formed of a metal or a metal nitride. Examples of material that may be used as the upper electrode 134 include titanium, titanium nitride, tantalum, tantalum nitride, tungsten, tungsten nitride, and the like. The upper electrode 134 may be formed as a single layer or a plurality of layers by using the material.

A bit line 150 may be formed on the third interlayer insulating layer 130 and the upper electrode 134, and may be electrically connected to the MTJ structure 140 through the upper electrode 134. The bit line 150 may extend to cross a word line at right angles.

Referring now to FIG. 10B, an MTJ structure 160 of the MRAM 100c may be different than the MTJ structure 140 of the MRAM 100c of FIG. 10A. For example, the MTJ structure 160 of the MRAM 100c may have a perpendicular structure.

More specifically, the MTJ structure 160 may be formed on a lower electrode 132. In some embodiments, the lower electrode 132 may be included in the MTJ structure 160. The MTJ structure 160 may include a lower pinned layer 161a, a coupling layer 161b, an upper pinned layer 161c, a tunnel layer structure 162, a free layer 163, and a capping layer 166.

The lower pinned layer 161a may contact the lower electrode 132 and be magnetized in a direction that is perpendicular to the tunnel layer structure 162, and the magnetization direction may be fixed. The coupling layer 161b and the upper pinned layer 161c may be formed on the lower pinned layer 161a. The coupling layer 161b may include Ru. The upper pinned layer 161c may be magnetized in a direction that is perpendicular to an opposite direction to the lower pinned layer 161a. The upper pinned layer 161c may have a coercive force that is lower than that of the lower pinned layer 161a.

The coupling layer 161b and the pinned layer 161c may have a width that is greater than that of the lower pinned layer 161a. Accordingly, the coupling layer 161b may completely cover the upper surface of the lower pinned layer 161a. The upper pinned layer 161c may have a thickness that is less than that of the lower pinned layer 161a. The lower pinned layer 161a, the coupling layer 161b, and the upper pinned layer 161c may form a pinned layer structure 161. An insulating spacer 165 may be formed at the side of the lower pinned layer 161a, and the side of the coupling layer 161b and the side of the upper pinned layer 161c may form the same plane together with the side of the insulating spacer 165.

The tunnel layer structure 162 may have a structure in which a first interface layer 162a, a metal oxide layer 162b, and a second interface layer 162c are stacked. The first interface layer 162a may be magnetized in a horizontal direction. The second interface layer 162c may be magnetized in a direction that is opposite to the magnetization direction of the first interface layer 162a. Each of the first and second interface layers 162a and 162c may include CoFeB, CoFe, NiFe, or the like. The metal oxide layer 162b may include MgO, AlOx, or the like.

The free layer 163 may have a magnetization direction that is changeable in a direction that is perpendicular to the tunnel layer structure 162. The free layer 163 may be formed of a ferromagnetic material, and may be formed by using a material having high spin polarization intensity. For example, the free layer 163 may be formed of CoFeB, CoFe, NiFe, FePt, or CoPt.

The capping layer 166 may include tantalum. An upper electrode 134 and a bit line 150 are the same as those described with reference to FIG. 10A.

Figure 11:
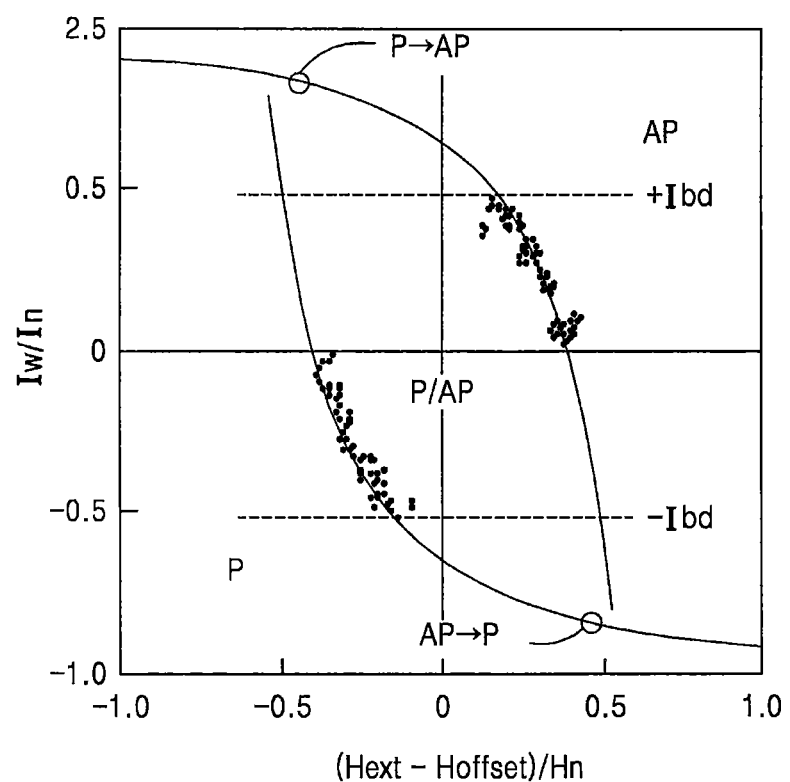
FIG. 11 is a graph illustrating a change in a write current of MRAM, according to an external magnetic field.

Referring now to FIG. 11, a graph showing a change in a write current of MRAM according to an external magnetic field in accordance with some embodiments of the present inventive concept will be discussed. As illustrated in FIG. 11, the X-axis denotes a value obtained by normalizing the external magnetic field, and the Y-axis denotes a value obtained by normalizing the write current. Dashed lines denote breakdown currents +Ibd and −Ibd, P denotes that the magnetization direction of a free layer is in a parallel state, and AP denotes that the magnetization direction of the free layer is in an anti-parallel state.

Referring to FIG. 11, as the intensity of the external magnetic field increases, the write current may be greatly out of range of the breakdown currents +Ibd and −Ibd, and thus, a stable write operation may not be performed. For example, when the external magnetic field is "0", the write current may not be out of range of the breakdown currents +Ibd and −Ibd. However, when the external magnetic field is 0.5 or more, the write current may be greatly out of range of a lower breakdown current, i.e., the breakdown current −Ibd. In some embodiments, it may not be possible to change an anti-parallel magnetization state to a parallel magnetization state by applying a set write current, and thus, a write fail may occur. Furthermore, as described above, the external magnetic field may cause read disturbance as well as the write fail.

Accordingly, the frame buffering apparatus 1000 of FIG. 1 uses MRAM as the frame buffer memory 100 to reduce a size and power consumption thereof, and includes the magnetic field sensor 200 to detect an external magnetic field. Also, the frame buffering apparatus 1000 stops a write operation to the MRAM when the intensity of the external magnetic field is equal to or greater than a threshold voltage, so that the stability and reliability of the MRAM may be maintained and thus display images may be stably displayed.

In the graph of FIG. 11, Hext denotes an actual external magnetic field, Hoffset denotes an offset magnetic field that is off from the center when there is no external magnetic field, and Hn denotes a magnetic field for normalization and may be a threshold value that may change a magnetization direction only by a magnetic field. Points on the graph of FIG. 11 indicate write current values measured according to the intensity of an external magnetic field.

Figure 12A:
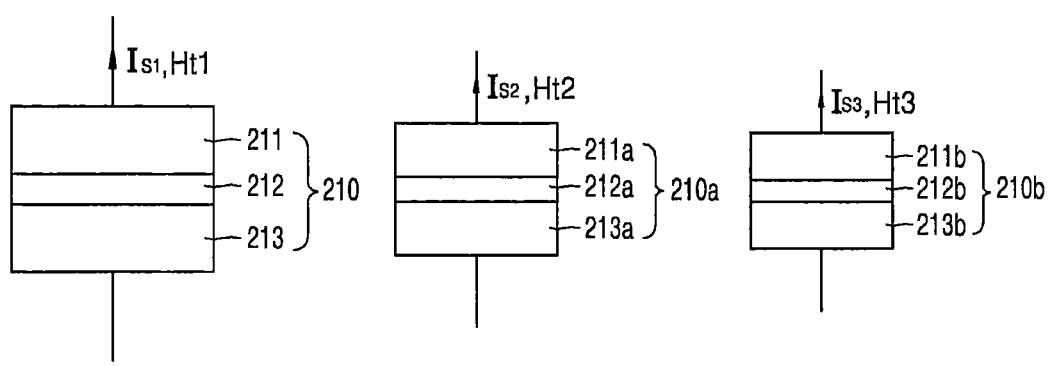
FIGS. 12A to 12C are conceptual diagrams illustrating MTJ structures forming a magnetic field sensor, according to some embodiments of the inventive concept.
Figure 12B:
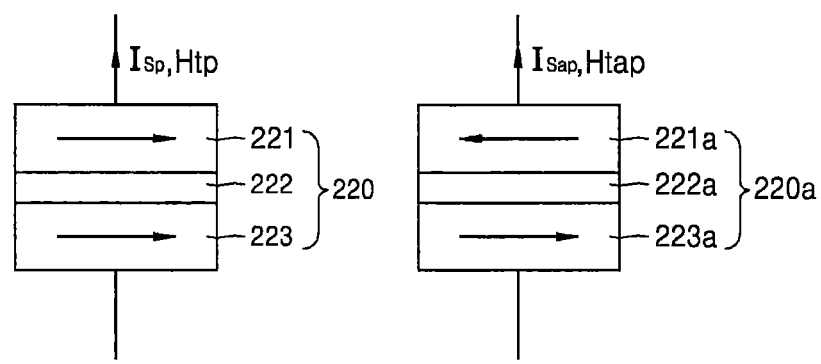
Figure 12C:
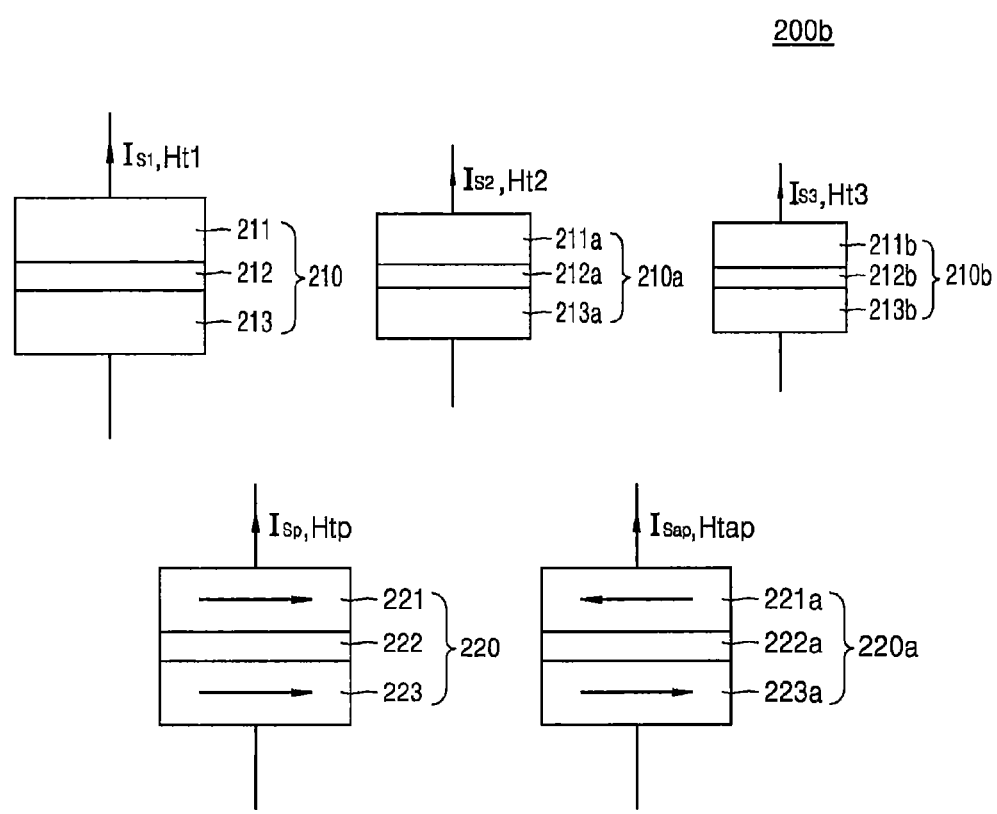

Referring now to FIGS. 12A to 12C, conceptual diagrams illustrating MTJ structures forming a magnetic field sensor according to some embodiments of the present inventive concept will be discussed. As illustrated in FIG. 12A, the magnetic field sensor 200 of the frame buffering apparatus 1000 illustrated in FIG. 1 may include MTJ structures having various sizes or forms, for example, first, second, and third MTJ structures 210, 210a, and 210b. As discussed above, a resistance value of each MTJ structure is changed according to the magnetization direction of a free layer. The magnetization direction of the free layer may be changed by an STT phenomenon occurring through the application of a write current and may also be changed purely by an external magnetic field. Hereinafter, the intensity of a magnetic field that may change the magnetization direction of the free layer is referred to as a threshold magnetic field Ht.

Accordingly, the intensity of an external magnetic field may be detected by measuring a current by using MTJ structures having various sizes and forms, in which the magnetization direction of a free layer may be changed according to the intensity of the external magnetic field. For example, the first MTJ structure 210 may have a first threshold magnetic field Ht1 of 1000 Gauss (G), the second MTJ structure 210a may have a second threshold magnetic field Ht2 of 500 G, and the third MTJ structure 210b may have a third threshold magnetic field Ht3 of 100 G. Furthermore, when the magnetization direction of each of the first, second, and third MTJ structures 210, 210a, and 210b is in an anti-parallel state and there is no external magnetic field, the first, second, and third MTJ structures 210, 210a, and 210b may have a first current value Is1, a second current value Is2, and a third current value Is3, respectively, by applying a predetermined voltage thereto.

If an external magnetic field of 500 G occurs in a direction that is opposite to the magnetization direction of a free layer of each of the first, second, and third MTJ structures 210, 210a, and 210b, the magnetization directions of the free layers of the second and third MTJ structures 210a and 210b, except for the first MTJ structure 210, may be changed. Accordingly, the first current value Is1 of the first MTJ structure 210 may remain substantially the same, whereas the second and third current values Is2 and Is3 of the second and third MTJ structures 210a and 210b may rapidly change. For example, in the second and third MTJ structures 210a and 210b, the second and third current values Is2 and Is3 may increase since the magnetization direction is in a parallel state. Accordingly, it may be detected that an external magnetic field, which is equal to or greater than 500 G and is less than 1000 G, occurred.

The occurrence of an external magnetic field may be more accurately detected by adopting various MTJ structures having different threshold magnetic fields Ht. However, when taking into account a process time and a level of process difficulty, forming various MTJ structures, which have different threshold magnetic fields Ht, on a single chip may not be desirable. The intensity of a magnetic field to be detected is a threshold value that may cause an error of a read or write operation of MRAM. Accordingly, an external magnetic field having the threshold value or more may be detected by disposing several MTJ structures having a threshold magnetic field Ht that is close to the threshold value and measuring a current value of each of the several MTJ structures.

The first, second, and third MTJ structures 210, 210a, and 210b forming the magnetic field sensor 200 may have different threshold magnetic fields Ht through various structures and methods. For example, the threshold magnetic fields Ht of the first, second, and third MTJ structures 210, 210a, and 210b may be different by making the sizes of the first, second, and third MTJ structures 210, 210a, and 210b be different, as illustrated in FIG. 12A. For example, the smaller an MTJ structure, the more the threshold magnetic field Ht thereof may decrease, and thus, the magnetization direction of the MTJ structure may be easily changed also by a small external magnetic field. Furthermore, the threshold magnetic fields Ht of the first, second, and third MTJ structures 210, 210a, and 210b may be different by making the thicknesses of the first, second, and third MTJ structures 210, 210a, and 210b be different. For example, the thinner a free layer of an MTJ structure, the more the threshold magnetic field Ht thereof may decrease. Furthermore, the threshold magnetic fields Ht of the first, second, and third MTJ structures 210, 210a, and 210b may be different by making the materials of the free layers of the first, second, and third MTJ structures 210, 210a, and 210b be different.

It will be understood that methods of making the threshold magnetic fields Ht of the first, second, and third MTJ structures 210, 210a, and 210b be different are not limited to the methods discussed herein. For example, various other methods of making the threshold magnetic fields Ht of the first, second, and third MTJ structures 210, 210a, and 210b be different may be used to implement the magnetic field sensor 200 without departing from the scope of the present inventive concept.

In some embodiments where the magnetization direction of a free layer is changed by an external magnetic field, the magnetization direction of the free layer may be restored to its original direction to detect the external magnetic field again later. In some embodiments, an STT phenomenon occurring by the application of a current may be used to restore the magnetization direction of the free layer to its original direction.

In embodiments where all the first, second, and third MTJ structures 210, 210a, and 210b are in an anti-parallel state and an external magnetic field occurs in a direction that is opposite to the magnetization direction of a free layer of each of the first, second, and third MTJ structures 210, 210a, and 210b has been described above. However, when an external magnetic field occurs in a direction that is the same as the magnetization direction of the free layer, the magnetization direction of the free layer is not changed and thus the external magnetic field may not be detected. Accordingly, MTJ structures forming the magnetic field sensor 200 have to be configured to detect the direction of a generated magnetic field as well as a threshold magnetic field Ht. A method of detecting the direction of a magnetic will be discussed below with respect to FIG. 12B.

Referring now to FIG. 12B, a magnetic field sensor 200a of the frame buffering apparatus 1000 illustrated in FIG. 1 will be discussed. As illustrated, the magnetic field sensor 200a of the frame buffering apparatus 1000 illustrated in FIG. 1 may include an MTJ structure 220 that is in a parallel state, and an MTJ structure 220a that is in an anti-parallel state. The magnetic field sensor 200a may detect the direction of an external magnetic field by using the two types of MTJ structures 220 and 220a.

More specifically, a threshold magnetic field Htp of the MTJ structure 220 and a threshold magnetic field Htap of the MTJ structure 220a each are 100 G and the MTJ structure 220 and the MTJ structure 220a have a first current value Isp and a second current value Isap, respectively, when a predetermined voltage is applied to the MTJ structure 220 and the MTJ structure 220a. the first current value Isp or the second current value Isap may be rapidly changed according to the direction of an external magnetic field of 200 G when the external magnetic field of 200 G is applied. For example, when the direction of an external magnetic field is the same as the magnetization direction of a free layer 221 of the MTJ structure 220 in a parallel state, the MTJ structure 220 in a parallel state remains unchanged, and the magnetization direction of a free layer 221a of the MTJ structure 220a in an anti-parallel state may be changed and thus the state of the MTJ structure 220a may be changed from the anti-parallel state to a parallel state. Accordingly, the second current value Isap may increase. On the contrary, when the direction of an external magnetic field is the same as the magnetization direction of the free layer 221a of the MTJ structure 220a in an anti-parallel state, the MTJ structure 220a in an anti-parallel state remains unchanged, and the magnetization direction of the free layer 221 of the MTJ structure 220 in a parallel state may be changed and thus the state of the MTJ structure 220 may be changed from the parallel state to an anti-parallel state. Accordingly, the first current value Isp may decrease.

As a result, the direction of an external magnetic field may be detected according to which one of current values of the two types of MTJ structures 220 and 220a is changed. However, when there is a change in current in connection with the intensity of an external magnetic field, it may be understood that the intensity of the external magnetic field is larger than a threshold magnetic field of a corresponding MTJ structure.

Referring to FIG. 12C, the intensity of an external magnetic field may be detected by using various MTJ structure having different threshold magnetic fields, as described with reference to FIG. 12A. Furthermore, the direction of an external magnetic field may be detected by using MTJ structures that are in different states, as described with reference to FIG. 12B. In these embodiments, the two cases may be combined with each other to detect both the intensity and the direction of an external magnetic field.

For example, a magnetic field sensor 200b illustrated in FIG. 12C may include the MTJ structures 210, 210a, and 210b having different threshold magnetic fields Ht1, Ht2, and Ht3, respectively, and the first and second MTJ structures 220 and 220a having the threshold magnetic fields Htp and Htap in different states. Accordingly, the intensity of an external magnetic field may be detected by using three MTJ structures, i.e., the first, second, and third MTJ structures 210, 210a, and 210b, and the direction of the external magnetic field may be detected by using two MTJ structures, i.e., the first and second MTJ structures 220 and 220a. The two MTJ structures, namely, the first and second MTJ structures 220 and 220a, may also be used to detect the intensity of the external magnetic field together with the three MTJ structures, namely, the first, second, and third MTJ structures 210, 210a, and 210b.

Figure 13A:
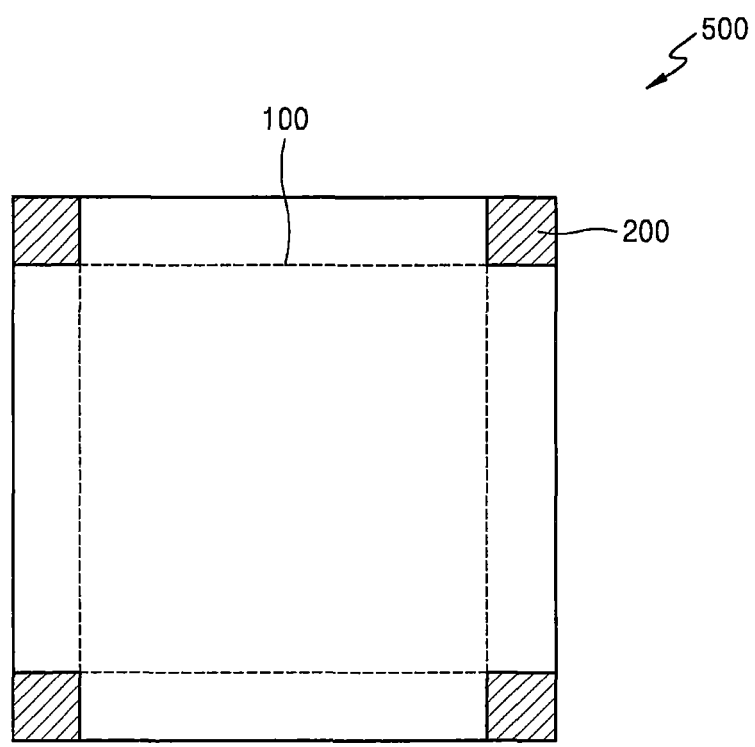
FIGS. 13A to 13C are conceptual diagrams illustrating structures in which MRAM and a magnetic field sensor are formed in a single chip, according to some embodiments of the inventive concept.
Figure 13B:
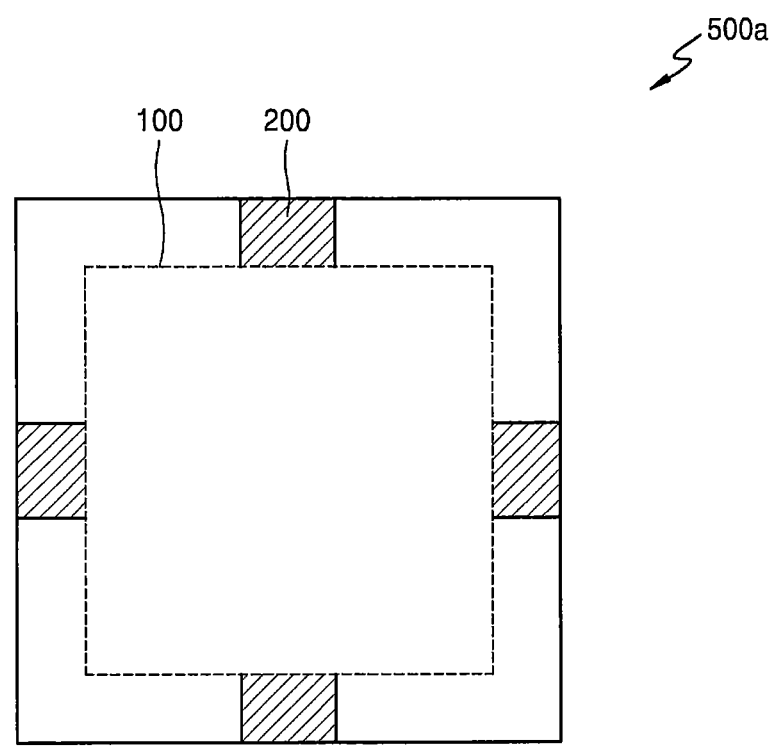
Figure 13C:
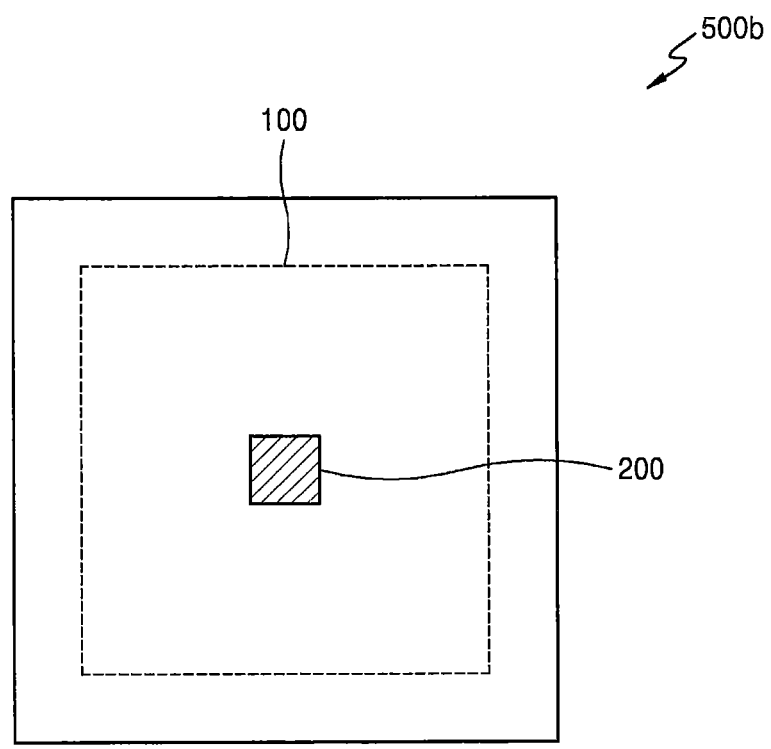

Referring now to FIGS. 13A to 13C, conceptual diagrams showing structures in which MRAM and a magnetic field sensor are formed in a single chip according to some embodiments of the inventive concept will be discussed. As illustrated in FIG. 13A, in the frame buffering apparatus 1000 of FIG. 1, a frame buffer memory 100, i.e., MRAM 100, and a magnetic field sensor 200 may be formed in a single chip 500. As discussed above with respect to FIGS. 12A to 12C, the magnetic field sensor 200 may be formed to have an MTJ structure. Accordingly, the magnetic field sensor 200 may be formed together with the MRAM 100 through the same process when manufacturing the MRAM 100, and may be formed in the single chip 500 together with the MRAM 100.

When the MRAM 100 and the magnetic field sensor 200 are formed in the single chip 500, the MRAM 100 may be disposed in a central portion of the single chip 500 and the magnetic field sensor 200 may be disposed in vertex portions of the single chip 500. The magnetic field sensor 200 may be formed in at least one of four vertex portions of the single chip 500. For example, the magnetic field sensor 200 may be formed in all the four vertex portions of the single chip 500, as shown in FIG. 13A. The magnetic field sensor 200 may be formed by a combination of a plurality of MTJ structures having various sizes and/or various states, as illustrated in FIGS. 12A to 12C.

In a single chip 500a of FIG. 13B, the position of a magnetic field sensor 200 may be different from that of the magnetic field sensor 200 in the single chip 500 of FIG. 13A. For example, in the single chip 500a of FIG. 13B, the magnetic field sensor 200 may be disposed in a central portion of at least one selected from four sides of the single chip 500a. In some embodiments, the magnetic field sensor 200 may be formed in all the four sides of the single chip 500a, as shown in FIG. 13B.

In a single chip 500b of FIG. 13C, a magnetic field sensor 200 may be positioned in a central portion of the single chip 500b, for example, a central portion of MRAM 100, unlike in the single chip 500 of FIG. 13A and the single chip 500a of FIG. 13B. However, the position of the magnetic field sensor 200 is not limited to the central portion of the single chip 500b. For example, the magnetic field sensor 200 may be disposed in several portions of the single chip 500b in a direction vertically or horizontally intersecting the center of the single chip 500b.

Although positions where the magnetic field sensor 200 is disposed when the magnetic field sensor 200 and the MRAM 100 are formed in a single chip have been described above, the inventive concept is not limited thereto. For example, the magnetic field sensor 200 may be disposed in both a central portion and an outer portion of a single chip or may be disposed in any position of a single chip regardless of the central portion and the outer portion.

Figure 14:
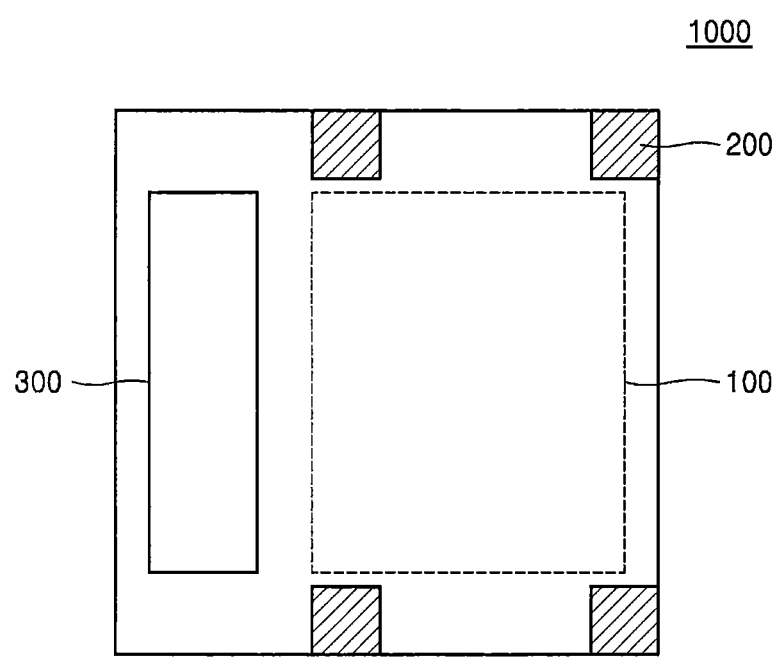
FIG. 14 is a conceptual diagram illustrating a structure in which MRAM, a magnetic field sensor, and a frame buffer controller are formed in a single chip according to some embodiments of the inventive concept.

Referring now to FIG. 14, a conceptual diagram showing a structure in which MRAM, a magnetic field sensor, and a frame buffer controller are formed in a single chip according to some embodiments of the inventive concept will be discussed. As illustrated in FIG. 14, a frame buffering apparatus 1000 according to a current embodiment may have a structure in which MRAM 100, a magnetic field sensor 200, and a frame buffer controller 300 may be formed in a single chip. For example, the MRAM 100 may be disposed in the right portion of the single chip, the magnetic field sensor 200 may be disposed outside the MRAM 100, and the frame buffer controller 300 may be disposed in the left portion of the single chip while being separate from the MRAM 100.

In the frame buffering apparatus 1000, the single chip may denote an integrated chip (IC) in which the MRAM 100, the magnetic field sensor 200, and the frame buffer controller 300 are formed together. However, in some embodiments, the single chip may denote a semiconductor package in which a second chip, in which the frame buffer controller 300 is formed, is stacked on a first chip, in which the MRAM 100 and the magnetic field sensor 200 are formed, or the first chip is stacked on the second chip. A structure of a semiconductor package in which a first chip and a second chip are stacked will be discussed further below with respect to FIGS. 17A to 17C.

The size of the frame buffering apparatus 1000 may be reduced since the MRAM 100, the magnetic field sensor 200, and the frame buffer controller 300 are integrated into a single chip. Accordingly, when the frame buffering apparatus 1000 is applied to a display apparatus, space utilization efficiency of the display apparatus may be improved.

Figure 15A:
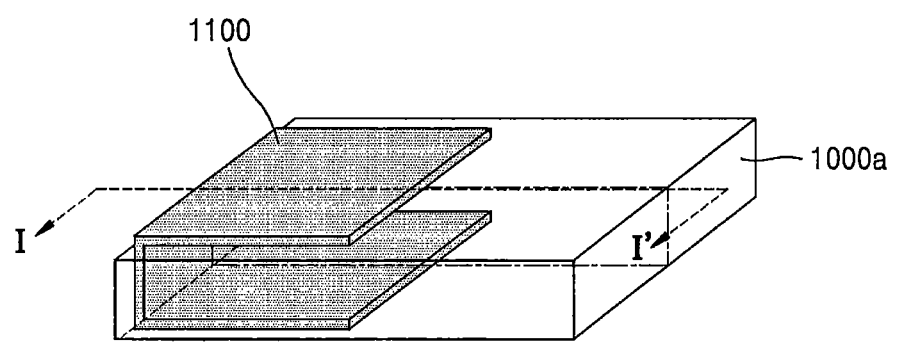
FIGS. 15A and 15B are a perspective view and a cross-section, respectively, illustrating a shielding structure of a semiconductor chip including perpendicular MRAM, according to some embodiments of the inventive concept.
Figure 15B:
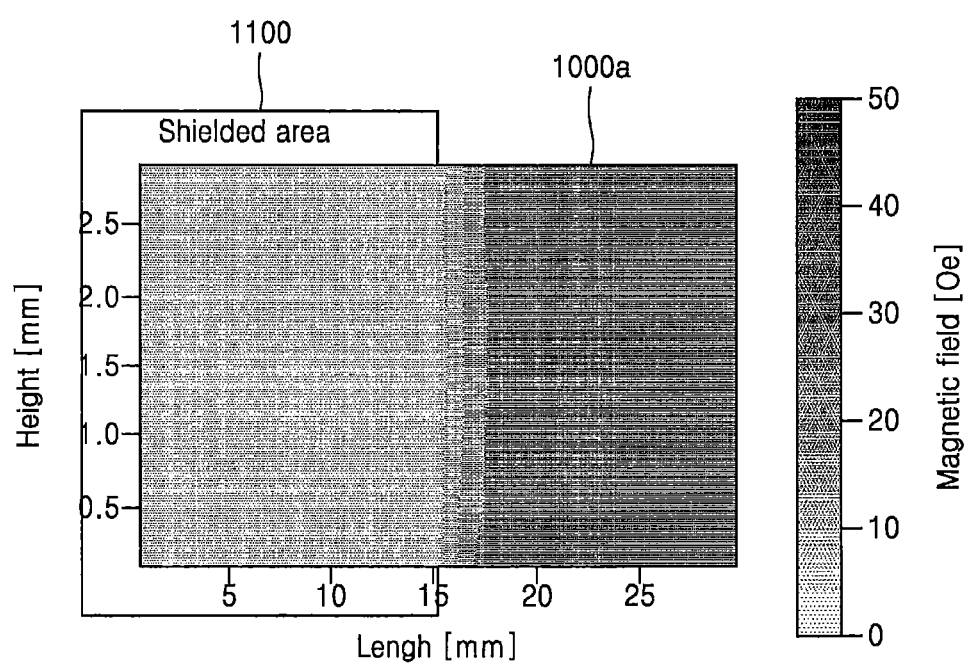

Referring now to FIGS. 15A and 15B, a perspective view and a cross-section, respectively, which show a shielding structure of a semiconductor chip 1000a including perpendicular MRAM according to some embodiments of the inventive concept will be discussed. FIG. 15B is a cross-section taken along a line I-I' of FIG. 15A. As illustrated in FIGS. 15A and 15B, in the case of the semiconductor chip 1000a including the perpendicular MRAM, a shielding layer 1100 may be formed to cover the side of the semiconductor chip 1000a as well as the upper and lower surfaces of the semiconductor chip 1000a to reduce the influence of an external magnetic field. The perpendicular MRAM may have a structure in which the magnetization directions of two magnetic layers, i.e., a pinned layer and a free layer, are perpendicular to a tunnel layer, as described with reference to FIG. 7. The shielding layer 1100 may be formed of materials that may block an external magnetic field. For example, the shielding layer 1100 may be formed of an alloy of Co, Fe, B, and the like.

More specifically, in a perpendicular MRAM structure, when the direction of an external magnetic field is a horizontal direction that is perpendicular to the magnetization direction of a magnetic layer, it may be difficult to change the magnetization direction of the perpendicular MRAM through the side of the semiconductor chip 1000a. However, when the direction of the external magnetic field is a vertical direction that is the same as the magnetization direction of the magnetic layer, it may be possible to change the magnetization direction of the perpendicular MRAM through the side of the semiconductor chip 1000a. In particular, magnetic layers of MRAMs that are disposed in an outer side portion of the semiconductor chip 1000a may be greatly influenced by the external magnetic field. Accordingly, in the perpendicular MRAM structure, the shielding layer 1100 may be formed to cover the side of the semiconductor chip 1000a as well as the upper and lower surfaces of the semiconductor chip 1000a to reduce the influence of the external magnetic field.

As illustrated in FIG. 15B, it may be understood that the influence of an external magnetic field greatly decreases in an area in which the shielding layer 1100 is formed. That is, when an external magnetic field exists, a strong magnetic force occurs in a right portion of the semiconductor chip 1000a due to the influence of the external magnetic field (see a dark region of FIG. 15B). On the other hand, since the external magnetic field is blocked in a left portion of the semiconductor chip 1000a, covered by the shielding layer 1100, a weak magnetic force occurs in the left portion of the semiconductor chip 1000a (see a lighter region of FIG. 15B).

A structure in which only a portion of the side of the semiconductor chip 1000a is covered by the shielding layer 1100 is illustrated in FIGS. 15A and 15B. However, such a structure is only an exemplary structure for showing an effect of the shielding layer 1100, and actually, the entire side of the semiconductor chip 1000a may be covered by the shielding layer 1100 to effectively reduce the influence of the external magnetic field.

In the semiconductor chip 1000a, a magnetic field sensor may be formed along with the perpendicular MRAM. The magnetic field sensor may detect an external magnetic field inside the shielding layer 1100. Accordingly, when the external magnetic field is very strong enough to have an influence on write and read operations of the perpendicular MRAM even though the shielding layer 1100 is there, a frame buffer controller may stop a write operation to and/or a read operation from the perpendicular MRAM.

In these embodiments, although the shielding layer 1100 is formed to cover the side of the semiconductor chip 1000a, the shielding layer 1100 may be formed to cover only an area of the perpendicular MRAM inside the semiconductor chip 1000a.

Figure 16A:
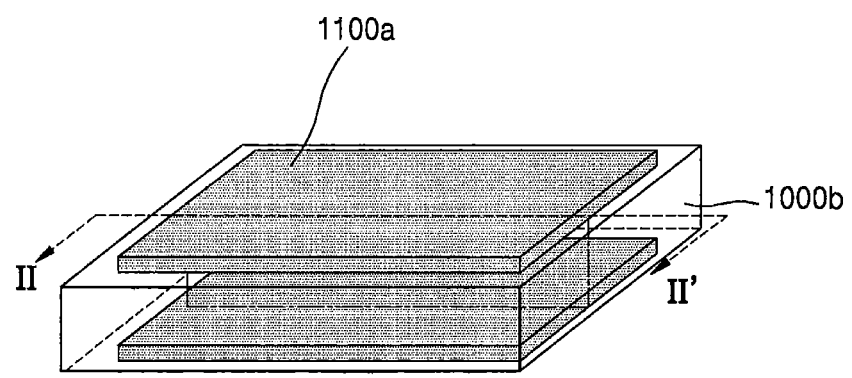
FIGS. 16A and 16B are a perspective view and a cross-section, respectively, illustrating a shielding structure of a semiconductor chip including planar MRAM, according to some embodiments of the inventive concept.
Figure 16B:
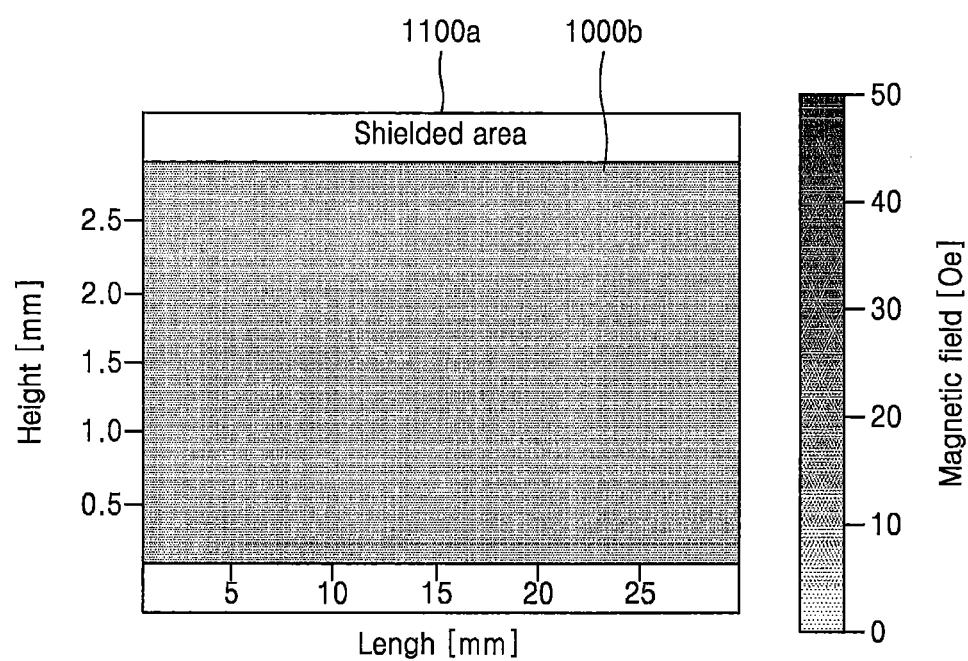

Referring now to FIGS. 16A and 16B, a perspective view and a cross-section, respectively, which show a shielding structure of a semiconductor chip 1000b including planar MRAM according to some embodiments of the inventive concept will be discussed. FIG. 16B is a cross-section taken along a line II-II' of FIG. 16A. As illustrated in FIGS. 16A and 16B, in the case of the semiconductor chip 1000b including the planar MRAM, a shielding layer 1100a may be formed to cover only the upper and lower surfaces of the semiconductor chip 1000b to reduce the influence of an external magnetic field. The planar MRAM may have a structure in which the magnetization directions of two magnetic layers, i.e., a pinned layer and a free layer, are horizontal with respect to a tunnel layer, as described with reference to FIG. 6. The shielding layer 1100b may be formed of materials that may block an external magnetic field.

More specifically, in a planar MRAM structure, when the direction of an external magnetic field is a horizontal direction that is the same as the magnetization direction of a magnetic layer, the external magnetic field may be blocked by the shielding layer 1100a formed on the upper and lower surface of the semiconductor chip 1000b. When the direction of the external magnetic field is a vertical direction that is perpendicular to the magnetization direction of the magnetic layer, it may not be possible to change the magnetization direction of the planar MRAM through the side of the semiconductor chip 1000b. Accordingly, in the case of the semiconductor chip 1000b including the planar MRAM, a shielding layer may not be formed on the side of the semiconductor chip 1000b.

As illustrated in FIG. 16B, it may be understood that even though the shielding layer 1100a is formed only on the upper and lower surfaces of the semiconductor chip 1000b, the external magnetic field is sufficiently blocked (see a lighter region of FIG. 15B). Furthermore, it may be understood that a magnetic force occurring at the side of the semiconductor chip 1000b, which is not covered by the shielding layer 1100a, is not much different from that occurring in other portions of the semiconductor chip 100b.

In the semiconductor chip 1000b, a magnetic field sensor may be formed along with the planar MRAM. Furthermore, the current embodiment is not limited to a structure in which the shielding layer 1100a is formed on the upper and lower surfaces of the semiconductor chip 1000a. For example, the shielding layer 1100a may be formed on upper and lower portions of a planar MRAM area inside the semiconductor chip 1000a.

In general, the perpendicular MRAM has higher tolerance to an external magnetic field than the planar MRAM. Accordingly, forming MRAMs of the semiconductor chips 1000a of a perpendicular type may be advantageous in terms of reliability. However, a perpendicular MTJ structure for forming the perpendicular MRAM may be more complicated in terms of manufacture and structure than a planar MTJ structure for forming the planar MRAM. Also, the perpendicular MTJ structure may be disadvantageous since a shielding layer has to be made in a form covering the entire surface of a semiconductor chip. On the other hand, the planar MTJ structure has an advantage that the making thereof is easy and the form of a shielding layer is simple, but has a disadvantage that tolerance to an external magnetic field is weak.

MRAM that is used as a frame buffer memory according to the current embodiment may be made as a perpendicular type or a planar type in consideration of characteristics described above. Furthermore, the magnetic field sensor may be formed to have any of the perpendicular and planar MTJ structures. However, the magnetic field sensor may be advantageously formed in a form of the same MTJ structure as the MRAM in the case that the magnetic field sensor and the MRAM are integrated into a single chip.

Figure 17A:
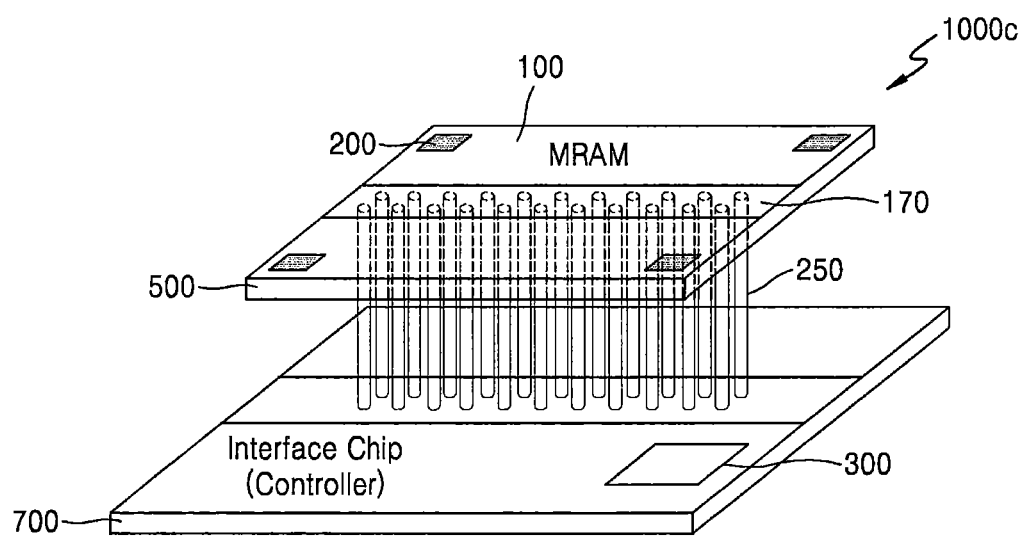
FIG. 17A is a perspective view of a frame buffering apparatus in which a single chip including MRAM and a magnetic field sensor is stacked on an interface chip through through-silicon vias (TSVs), according to some embodiments of the inventive concept.

Referring now to FIG. 17A, a perspective view of a frame buffering apparatus 1000c in which a single chip including an MRAM and a magnetic field sensor is stacked on an interface chip through through-silicon vias (TSVs) according to some embodiments of the inventive concept will be discussed. As illustrated in FIG. 17A, an interface chip 700 may be positioned as a lower layer of the frame buffering apparatus 1000c and an MRAM chip 500 may be positioned in an upper layer of the frame buffering apparatus 1000c. The interface chip 700 may include a frame buffer controller 300, and the MRAM chip 500 may include MRAM 100 and a magnetic field sensor 200. The interface chip 700 may include various control units as well as the frame buffer controller 300.

The magnetic field sensor 200 may be disposed in the outer portion of the MRAM chip 500, a connection area 170 may be included in the central portion of the RAM chip 500, and the MRAM 100 may be disposed at both sides of the connection area 1700. Connection units, for example, TSVs 250 and bumps (not shown), may be disposed in the connection area 170. In FIG. 17A, although one MRAM chip 500 is stacked on the interface chip 700, the inventive concept is not limited thereto and two or more MRAM chips may be stacked on the interface chip 700.

In this manner, the frame buffering apparatus 1000c may have a structure in which the MRAM chip 500 including the MRAM 100 and the magnetic field sensor 200 is stacked on the interface chip 700 including the frame buffer controller 300 through the TSVs 250 to form a semiconductor package. The structure may be implemented through a wire-bonding or a flip-chip bonding instead of the TSVs 250.

Figure 17B:
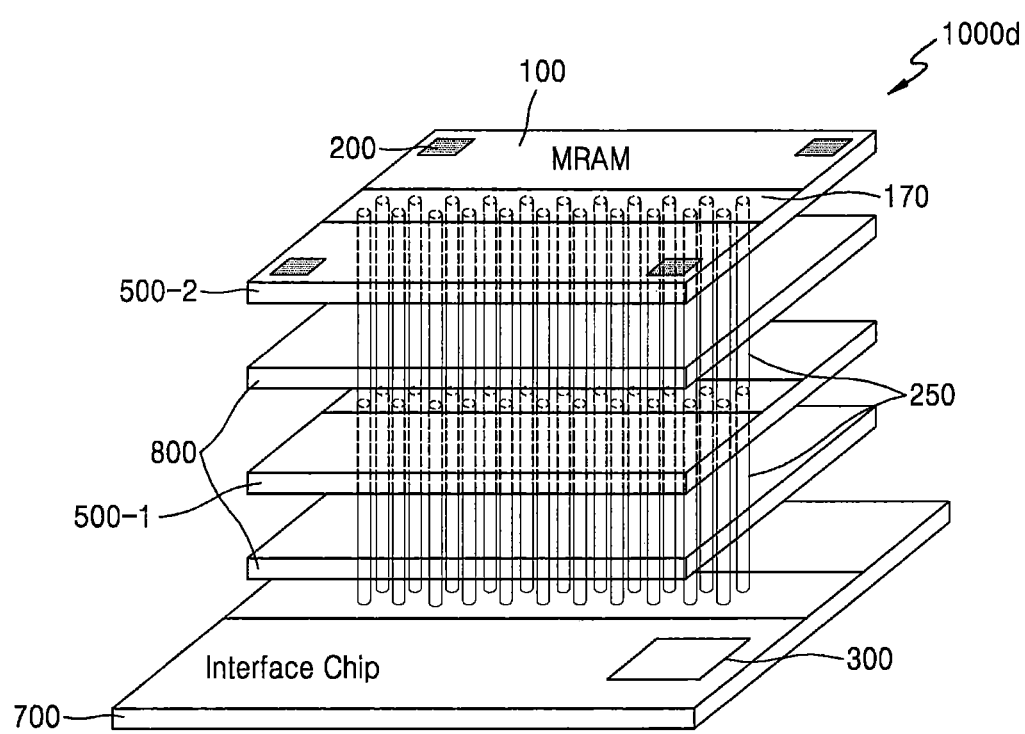
FIG. 17B is a perspective view of a frame buffering apparatus in which a single chip including MRAM and a magnetic field sensor is stacked on an interface chip through TSVs, according to some embodiments of the inventive concept.

Referring now to FIG. 17B, a perspective view of a frame buffering apparatus 1000d in which a single chip including MRAM and a magnetic field sensor is stacked on an interface chip through TSVs according to some embodiments of the inventive concept will be discussed.

In the frame buffering apparatus 1000d illustrated in FIG. 17B, two MRAM chips 500-1 and 500-2 may be stacked on an interface chip 700, and a magnetic field protection layer 800 may be disposed between the interface chip 700 and the MRAM chip 500-1 and between the MRAM chip 500-1 and the MRAM chip 500-2.

The magnetic field protection layer 800 may block a magnetic field occurring between the interface chip 700 and the MRAM chip 500-1 and a magnetic field occurring between the MRAM chip 500-1 and the MRAM chip 500-2 according to the supply of an operating voltage. Also, the magnetic field protection layer 800 may block an external magnetic field.

Accordingly, the MRAM chips 500-1 and 500-2 may stably operate, and thus, data errors occurring in MRAM cells of the MRAM chips 500-1 and 500-2 may be minimized. Furthermore, the magnetic field protection layer 800 may reduce a change in the operating voltage according to a monitoring result that is generated and transmitted in real time.

A magnetic field sensor 200 may be formed in the uppermost MRAM chip, that is, the MRAM chip 500-2, to detect an external magnetic field. However, the magnetic field sensor 200 may also be formed in the MRAM chip 500-1. Also, the magnetic field sensor 200 may detect a magnetic field occurring between the interface chip 700 and the MRAM chip 500-1 and a magnetic field occurring between the MRAM chip 500-1 and the MRAM chip 500-2 as well as the external magnetic field.

Figure 17C:
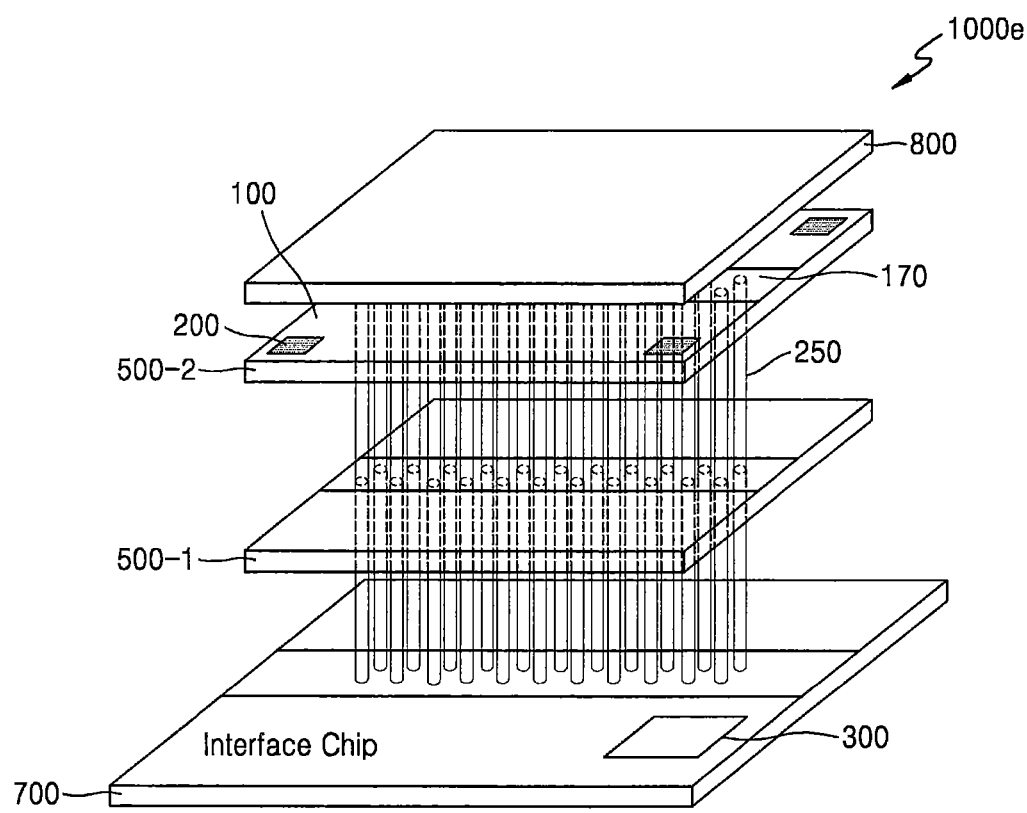
FIG. 17C is a perspective view of a frame buffering apparatus in which a single chip including MRAM and a magnetic field sensor is stacked on an interface chip through TSVs, according to some embodiments of the inventive concept.

Referring now to FIG. 17C, a perspective view of a frame buffering apparatus 1000e in which a single chip including MRAM and a magnetic field sensor is stacked on an interface chip through TSVs according to some embodiments of the inventive concept will be discussed.

In the frame buffering apparatus 1000e illustrated in FIG. 17C, two MRAM chips 500-1 and 500-2 may be stacked on an interface chip 700 and a magnetic field protection layer 800 may be disposed as the uppermost layer of the frame buffering apparatus 1000e. As the magnetic field protection layer 800 is disposed as the uppermost layer of the frame buffering apparatus 1000e, an external magnetic field may be blocked. Accordingly, malfunctions of the MRAM chips 500-1 and 500-2, which may occur due to an external magnetic field, may be reduced.

A magnetic field sensor 200 may be formed in the uppermost MRAM chip, that is, the MRAM chip 500-2, to detect an external magnetic field. However, the magnetic field sensor 200 may also be formed in the MRAM chip 500-1. Also, the magnetic field sensor 200 may detect a magnetic field occurring between the interface chip 700 and the MRAM chip 500-1 and a magnetic field occurring between the MRAM chip 500-1 and the MRAM chip 500-2 as well as the external magnetic field.

Also in the frame buffering apparatus 1000e, a magnetic field protection layer 800 may be disposed between the interface chip 700 and the MRAM chip 500-1 and between the MRAM chip 500-1 and the MRAM chip 500-2 to block a magnetic field occurring between the interface chip 700 and the MRAM chip 500-1 and a magnetic field occurring between the MRAM chip 500-1 and the MRAM chip 500-2.

In FIGS. 17A to 17C, a shielding layer may not be formed on the MRAM chips 500, 500-1, and 500-2. However, a shielding layer like the shielding layers 1100 and 1100a shown in FIGS. 15A to 16B may be formed on the MRAM chips 500, 500-1, and 500-2.

Figure 18:
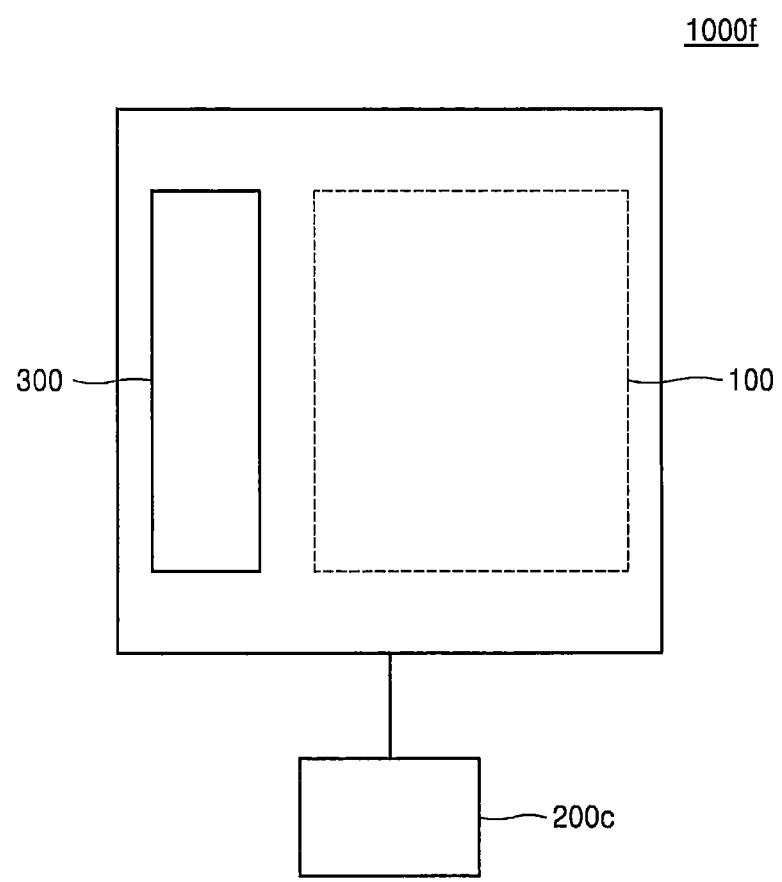
FIG. 18 is a conceptual diagram of a frame buffering apparatus using a magnetic field sensor formed in a different structure than MRAM, according to some embodiments of the inventive concept.

Referring now to FIG. 18, a conceptual diagram of a frame buffering apparatus 1000f using a magnetic field sensor formed in a different structure than MRAM according to some embodiments of the inventive concept will be discussed. In the frame buffering apparatus 1000f illustrated in FIG. 18, a magnetic field sensor 200c may be formed independently of MRAM 100 and may be electrically connected to the MRAM 100 through an interconnection line. The magnetic field sensor 200c may be formed by using various principles described with reference to FIG. 1. Also in the frame buffering apparatus 1000f, the magnetic field sensor 200c may be formed by using an MTJ structure if necessary.

As illustrated in FIG. 18, a frame buffer controller 300 and the MRAM 100 may be formed in a single chip form. However, the frame buffer controller 300 may be disposed on an interface chip, as illustrated in FIGS. 17A to 17C. Accordingly, the frame buffering apparatus 1000f may have a package structure in which an MRAM chip including the MRAM 100 formed therein is stacked on an interface chip. Furthermore, the magnetic field sensor 200c may also be stacked on the interface chip and thus may be packaged along with the MRAM chip.

Referring now to FIG. 19, a schematic block diagram of a display apparatus 10000 according to some embodiments of the inventive concept will be discussed. As illustrated in FIG. 19, the display apparatus 10000 may include a display driving apparatus 1000g, a graphics processor 2000, and a display panel 3000.

The graphics processor 2000 may transmit input image data related to an image to the display driving apparatus 1000g, the display driving apparatus 1000g may control various signals for driving the display panel 3000, and the display panel 3000 may display an image by using signals provided from the display driving apparatus 1000g.

The display panel 3000 may receive image data from a signal controller 500 of the display driving apparatus 1000g to display a still image and a moving image. For example, the display panel 3000 may display a still image when a plurality of consecutive frames have the same image data, and may display a moving image when the plurality of consecutive frames have different image data.

A plurality of gate lines and a plurality of data lines are arranged in the display panel 3000. When the plurality of gate lines extend in a horizontal direction, the plurality of data lines may extend in a vertical direction to intersect the plurality of gate lines. One gate line and one data line may be connected to one pixel, and one pixel may include a transistor functioning as a switching device connected to a gate line and a data line. A gate line may be connected to a gate terminal of the transistor, a data line may be connected to an input terminal of the transistor, and a capacitor may be connected to an output terminal of the transistor.

The display panel 3000 may be any one of various display panels for displaying images, such as a liquid crystal display (LED), a light-emitting diode (LED), a plasma display panel (PDP), and an organic LED (OLED) display.

The display driving apparatus 1000g may include a frame buffer memory 100, a magnetic field sensor 200, and the signal controller 500. The frame buffer memory 100 and the magnetic field sensor 200 are the same as the frame buffer memory 100 and the magnetic field sensor 200, illustrated in FIG. 1, respectively. The signal controller 500 may receive input image data and control signals (i.e., a vertical synchronization signal, a horizontal synchronization signal, a main clock signal, and a data enable signal) from the graphics processor 2000 and process the input image data and the control signals to be suitable for operating conditions of the display panel 3000, and then may generate and output a gate control signal and a data control signal.

The gate control signal may be input to a gate driver and may include a vertical synchronization start signal indicating output start of a gate-on pulse (i.e., a high duration of a gate signal) and a gate clock signal controlling an output timing of the gate-on pulse. The data control signal and image data may be input to a data driver, and the data control signal may include a horizontal synchronization start signal indicating an input start of the image data and a load signal indicating the application of a data voltage to a data line.

Figure 22:
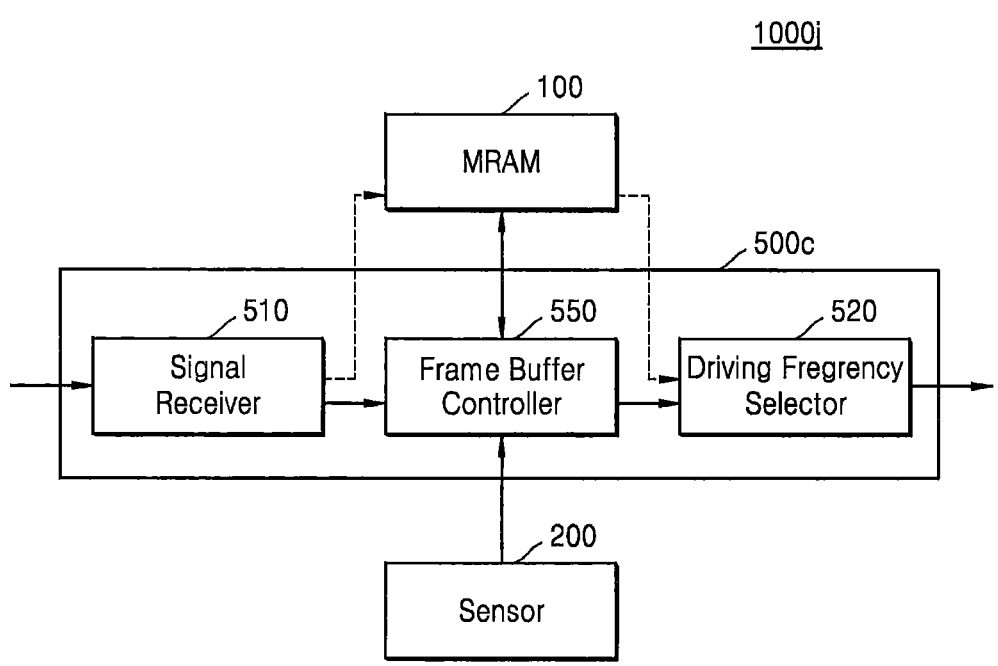
FIG. 22 is a block diagram of a display driving apparatus which shows in more detail a signal controller in the display apparatus of FIG. 19.

The signal controller 500 may include a frame buffer controller for PSR, for example, a frame buffer controller 550 of FIG. 22. The frame buffer controller may control the storage of frame data to the frame buffer memory 100 according to the intensity of an external magnetic field, as described with reference to FIG. 1. Accordingly, the frame buffer controller may receive information about the external magnetic field from the magnetic field sensor 200.

The magnetic field sensor 200 may transmit information about an external magnetic field, that is, information about the intensity and/or direction of an external magnetic field, to the frame buffer controller, as described above with reference to FIG. 1. The magnetic field sensor 200 may operate in two methods. A first method is a method in which the magnetic field sensor 200 detects an external magnetic field in real time and continuously transmits information about the detected external magnetic field to the frame buffer controller. A second method is a method in which the magnetic field sensor 200 transmits information about the detected external magnetic field to the frame buffer controller only when the intensity of the external magnetic field is equal to or greater than a threshold value.

In embodiments of the first method, it may be necessary to determine whether to stop an operation in which the frame buffer controller stores frame data in the frame buffer memory 100 with respect to the intensity and direction of any magnetic field. Accordingly, information about a detected magnetic field may be transmitted to the graphics processor 2000 through the frame buffer controller. The graphics processor 2000 may analyze the received information about a detected magnetic field and send a control signal to the frame buffer controller when it is necessary to stop the operation of storing the frame data in the frame buffer memory 100, and in these embodiments, the frame buffer controller may stop the operation of storing the frame data in the frame buffer memory 100 and directly transmit the frame data to a display panel.

In embodiments of the second method, no determination is needed since the magnetic field sensor 200 transmits information, which indicates that an external magnetic field that is equal to or greater than the threshold value occurred, to the frame buffer controller. Accordingly, the frame buffer controller may stop the operation of storing the frame data in the frame buffer memory 100 when the frame buffer controller receives a signal from the magnetic field sensor 200 and directly transmit the frame data to a display panel. In FIG. 19, a dashed line arrow corresponds to a path showing the flow of information about an external magnetic field.

The graphics processor 2000 transmits input image data related to an image to the signal controller 500 of the display driving apparatus 1000g. When the display panel 3000 displays a moving image, the graphics processor 2000 transmits the input image data to the signal controller for every frame. However, when the display panel 3000 displays a still image, the graphics processor 2000 does not need to continuously transmit input image data to the signal controller 500 since the frame buffer controller (for example, the frame buffer controller 550 of FIG. 22) of the signal controller 500 stores input image data received from the graphics processor 2000 in the frame buffer memory 100 by units of frames and transmits the stored input image data to the display panel 3000, that is, the frame buffer controller performs a PSR operation. In other words, when the display panel 3000 displays a still image, the graphics processor 2000 is deactivated and thus power consumption may be reduced.

Also in the case of displaying a still image, the frame buffer controller may receive information about a magnetic field from the magnetic field sensor 200, and may stop a PSR operation and activate the graphics processor 2000 when the intensity of an external magnetic field is equal to or greater than a threshold value, and thus an operation of transmitting input image data may be continuously performed. In some embodiments, the input image data may be directly transmitted to the display panel 3000 without being stored in the frame buffer memory 100.

The graphics processor 2000 may transmit a still image start signal to the signal controller 500 at a start time when the graphics processor 2000 transmits input image data corresponding to a still image while transmitting input image data corresponding to a moving image. Also, the graphics processor 2000 may transmit a still image end signal to the signal controller 500 at a start time when the graphics processor 2000 transmits input image data corresponding to a moving image after transmitting input image data corresponding to a still image. The still image end signal may be generated also when the intensity of an external magnetic field is equal to or greater than a threshold value.

In the display apparatus 10000, the display driving apparatus 1000g may include a gate driver for driving a gate line and a data driver for driving a data line. A plurality of gate lines of the display panel 3000 may be connected to the gate driver, and the gate driver may alternately apply a gate-on voltage and a gate-off voltage to a gate line according to a gate control signal applied from the signal controller 500. A plurality of data lines of the display panel 3000 may be connected to the data driver, and the data driver may receive a data control signal and image data from the signal controller 500. The data driver may convert the image data into a data voltage by using a grayscale voltage generated by a grayscale voltage generator and may transmit the data voltage to a data line.

Figure 20:
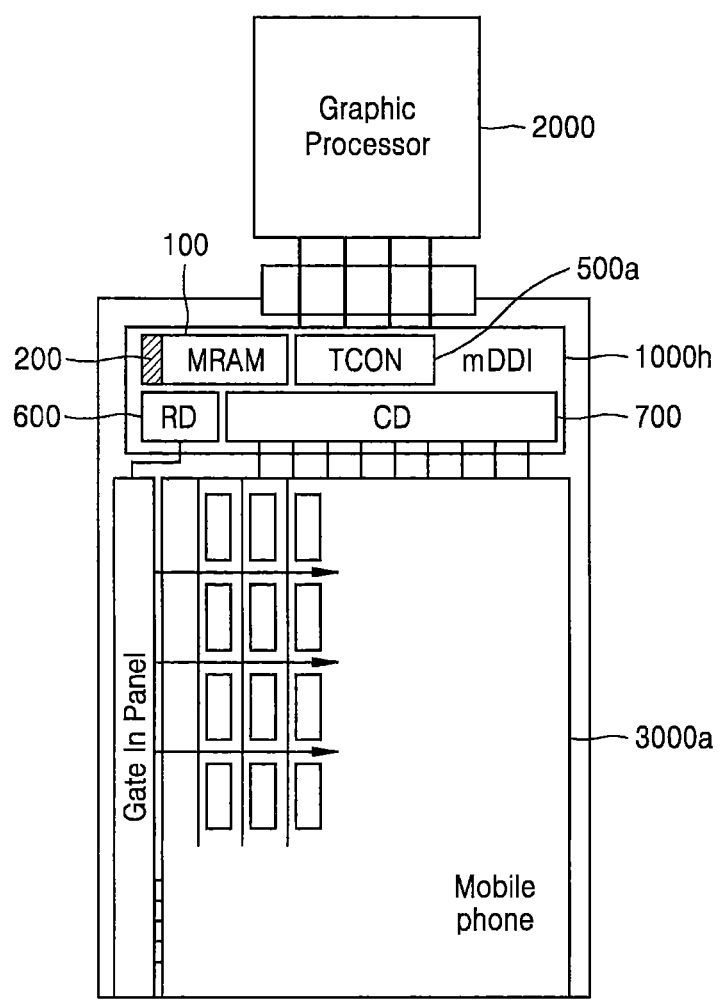
FIG. 20 is a schematic block diagram of a mobile system using the display apparatus of FIG. 19.

Referring now to FIG. 20, a schematic block diagram of a mobile system using the display apparatus 10000 of FIG. 19 will be discussed. As illustrated in FIG. 20, in the mobile system, for example, a mobile phone, a display driving apparatus 1000h for driving a display panel 3000a may be implemented in a single chip structure since the display panel 3000a is relatively small. Accordingly, a signal controller 500a, a frame buffer memory 100, a magnetic field sensor 200, a gate driver 600, and a data driver 700, which are included in the display driving apparatus 1000h, may be integrated into a single chip or a single package. "TCON" is the abbreviation for timing controller and corresponds to the signal controller 500a. The frame buffer memory 100 may be formed as MRAM, and the magnetic field sensor 200 may be formed in a body with the MRAM. "mDDI" is the abbreviation for mobile display drive IC and corresponds to the display driving apparatus 1000h. "RD" is the abbreviation for row decoder and corresponds to the gate driver 600. "CD" is the abbreviation of column decoder and corresponds to the data driver 700.

Figure 21:
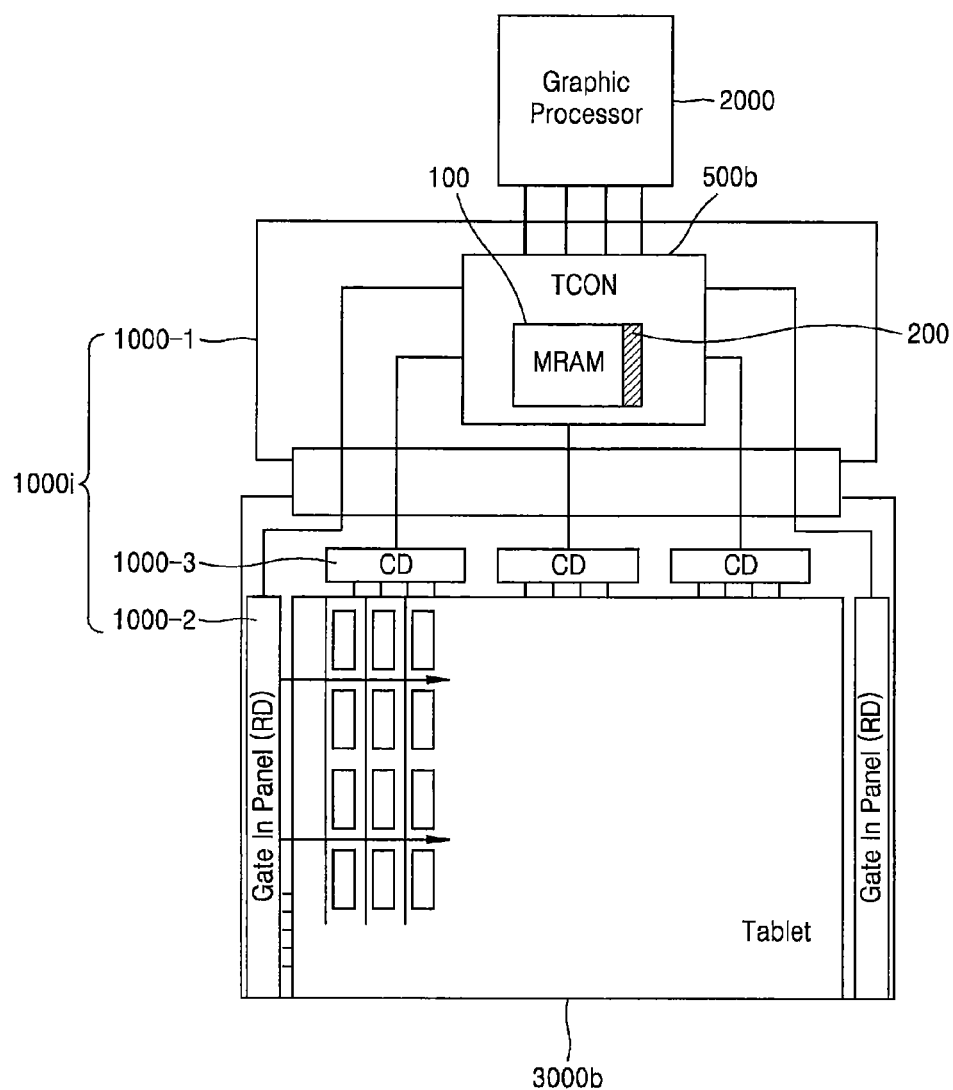
FIG. 21 is a schematic block diagram of a tablet system using the display apparatus of FIG. 19.

Referring now to FIG. 21, a schematic block diagram of a tablet system using the display apparatus 10000 of FIG. 19 will be discussed. As illustrated in FIG. 21, in the tablet system, for example, a tablet notebook, a display driving apparatus 1000i may not be implemented in a single chip structure since a display panel 3000b is relatively large. Accordingly, the display driving apparatus 1000i may include a TCON chip 1000-1, a gate driver chip 1000-2, and a data driver chip 1000-3, and the TCON chip 1000-1, the gate driver chip 1000-2, and the data driver chip 1000-3 may be separately disposed in appropriate portions of the display panel 3000b. The TCON chip 1000-1 includes a signal controller 500b. For example, the TCON chip 1000-1 may be disposed on the back of the display panel 3000b, and the gate driver chip 1000-2 and the data driver chip 1000-3 may be disposed outside the display panel 3000b.

The TCON chip 1000-1 may include MRAM as a frame buffer memory 100, and may further include a magnetic field sensor 200 formed in a body with the frame buffer memory 100. As described above, the signal controller 500b, which controls signals for driving the display panel 3000b, may be disposed in the TCON chip 1000-1.

The tablet system of FIG. 21 is not limited to a tablet notebook, and examples of the tablet system may include a home TV or computer and other large display apparatuses for advertisement.

Referring now to FIG. 22, a block diagram of a display driving apparatus 1000j which shows in more detail the signal controller 500 in the display apparatus 10000 of FIG. 19 will be discussed. As illustrated in FIG. 22, the display driving apparatus 1000j may include an MRAM-based frame buffer memory 100, a magnetic field sensor 200, and a signal controller 500c. The frame buffer memory 100 and the magnetic field sensor 200 are the same as those described with reference to FIG. 1. The signal controller 500c may include a signal receiver 510, a frame buffer controller 550, and a driving frequency selector 520.

The signal receiver 510 may receive input image data, a still image start signal, and a still image end signal from the graphics processor 2000. The signal receiver 510 may be connected to the graphics processor 2000 through a main link and a subsidiary link, receive the input image data from the graphics processor 2000 through the main link, and receive the still image start signal and the still image end signal from the graphics processor 2000 through the subsidiary link. Also, the signal receiver 510 may transmit a signal indicating a driving state of the display panel 3000 to the graphics processor 2000 through the subsidiary link.

When the display panel 3000 displays a still image, the frame buffer controller 550 may store input image data received through the signal receiver 510 in the frame buffer memory 100 by units of frames and may transmit the input image data stored in the frame buffer memory 100 to the display panel 3000. When the display panel 3000 displays a moving image, the frame buffer memory 100 is not used and input image data may be transmitted to the display panel 3000. Furthermore, in the case that the intensity of an external magnetic field exceeds a threshold value when displaying a still image, input image data may be directly transmitted to the display panel 3000 without using the frame buffer memory 100.

The driving frequency selector 520 may select alternately a first frequency and a second frequency when the display panel 3000 displays a still image, and may select the first frequency when the display panel 3000 displays a moving image. When the display panel 3000 displays a still image, the driving frequency selector 520 may receive image data from the frame buffer memory 100 during m frames (where m is a natural number) and output the image data to the display panel 3000 based on the first frequency, and subsequently, may output image data, received from the frame buffer memory 100, to the display panel 3000 based on the second frequency during n frames (where n is a natural number). When the display panel 3000 displays a moving image, the driving frequency selector 520 may receive input image data from the signal receiver 510 and output the input image data to the display panel 3000 based on the first frequency. In some embodiments, the second frequency may be less than the first frequency.

In this manner, power consumption of the display apparatus 10000 may be reduced by displaying a still image alternately based on two frequencies when displaying the still image. In some embodiments, the driving frequency selector 520 may be omitted, and in these embodiments, a still image and a moving image may be displayed based on the same frequency.

While the inventive concept has been particularly shown and described with reference to exemplary embodiments thereof, it will be understood that various changes in form and details may be made therein without departing from the spirit and scope of the following claims.

What is claimed is:

1. A display driving apparatus comprising:
   a frame buffer memory comprising magnetic random access memory (MRAM) and storing at least one piece of frame data;
   a magnetic field sensor, coupled to the frame buffer memory, configured to detect an external magnetic field;
   a signal controller configured to control signals for driving a display panel and storing the at least one piece of frame data according to an intensity of the detected external magnetic field;
   a source driver configured to provide a data voltage to the display panel responsive to a data control signal and image data received from the signal controller; and
   a gate driver configured to provide a gate-on voltage and a gate-off voltage to the display panel responsive to a gate control signal received from the signal controller,
   wherein the at least one piece of frame data is stored in the frame buffer memory when the intensity of the external magnetic field is less than a threshold value; and wherein the at least one piece of frame data is transmitted to a display in real time if the intensity of the external magnetic field is greater than or equal to the threshold value.

2. The display driving apparatus of claim 1:
wherein the MRAM and the magnetic field sensor each comprise a magnetic tunnel junction (MTJ) structure; and
wherein the magnetic field sensor and the frame buffer memory are integrated into a single chip.

3. The display driving apparatus of claim 2, wherein the single chip comprises the signal controller, the source driver, and the gate driver.

4. The display driving apparatus of claim 2:
wherein the signal controller is provided on the single chip; and
wherein the source driver and the gate driver are provided on chips separate from the single chip.

5. The display driving apparatus of claim 1:
wherein the magnetic field sensor comprises at least two magnetic tunnel junction (MTJ) structures; and
wherein the at least two MTJ structures have one of a same magnetic field threshold value for magnetization reversal and at least two different magnetic field threshold values for magnetization reversal.

6. The display driving apparatus of claim 1:
wherein the magnetic field sensor comprises at least two magnetic tunnel junction (MTJ) structures; and
wherein some of the at least two MTJ structures have parallel MTJ structures and others of the at least two MTJ structures have an anti-parallel MTJ structure.

7. A display apparatus comprising:
a display panel configured to display an image;
a display driving apparatus, coupled to the display panel, configured to control signals for driving the display panel, control storage of frame data according to an intensity of an external magnetic field, and provide a voltage corresponding to the image to the display panel; and
a graphics processor configured to transmit input image data related to the image to the display driving apparatus,
wherein at least one piece of frame data associated with the image is stored when the intensity of the external magnetic field is less than a threshold value; and
wherein the at least one piece of frame data is transmitted to the display panel in real time if the intensity of the external magnetic field is greater than or equal to the threshold value.

8. The display apparatus of claim 7, wherein the display driving apparatus comprises:
a frame buffer memory comprising magnetic random access memory (MRAM) and storing at least one piece of frame data;
a magnetic field sensor configured to detect the external magnetic field;
a signal controller configured to control signals for driving the display panel and control the storing of the at least one piece of frame data according to the intensity of the detected external magnetic field;
a source driver configured to provide a data voltage to the display panel according to a data control signal and image data, received from the signal controller; and
a gate driver configured to provide a gate-on voltage and a gate-off voltage to the display panel according to a gate control signal received from the signal controller.

9. The display apparatus of claim 8:
wherein the MRAM and the magnetic field sensor each comprise a magnetic tunnel junction (MTJ) structure; and
wherein the magnetic field sensor, the frame buffer memory, the signal controller, the source driver, and the gate driver are integrated into a single chip.

10. The display apparatus of claim 8:
wherein the magnetic field sensor, the frame buffer memory, and the signal controller are integrated into a single chip; and
wherein the source driver and the gate driver are formed as a chip that is separate from the single chip.

11. A frame buffering apparatus comprising:
a frame buffer memory including magnetic random access memory (MRAM); and
a magnetic field sensor, coupled to the frame buffer memory, configured to sense intensity and direction of an external magnetic field applied to the frame buffer memory,
wherein the frame buffering apparatus is configured store at least one piece of frame data in the frame buffer memory when the intensity of the external magnetic field is less than a threshold value; and
wherein the frame buffering apparatus is configured to transmit the at least one piece of frame data to a display in real time if the intensity of the external magnetic field is greater than or equal to the threshold value.

12. The apparatus of claim 11:
wherein the MRAM comprises a magnetic tunnel junction (MTJ) structure; and
wherein the magnetic field sensor further comprises the MTJ structure.

13. The apparatus of claim 12, wherein the magnetic field sensor and the frame buffer memory are integrated on a single chip.

14. The apparatus of claim 11:
wherein the magnetic field sensor comprises a plurality of magnetic tunnel junction (MTJ) structures; and
wherein the plurality of MTJ structures have at least two different magnetic field threshold values for magnetization reversal.

15. The apparatus of claim 11:
wherein the magnetic field sensor comprises a plurality of magnetic tunnel junction (MTJ) structures; and
wherein some of the plurality of MTJ structures have a parallel MTJ structure and others of the plurality of MTJ structures have an anti-parallel MTJ structure.

16. The apparatus of claim 11:
wherein the MRAM has a perpendicular magnetic tunnel junction (MTJ) structure; and
wherein the magnetic field sensor has one of a perpendicular MTJ structure and a planar MTJ structure.

17. The apparatus of claim 11, wherein the magnetic field sensor detects one of the intensity of the external magnetic field and the intensity and direction of the external magnetic field.

* * * * *